US012699296B2

(12) United States Patent
　　　Rozbicki

(10) Patent No.:　US 12,699,296 B2
(45) Date of Patent:　　Aug. 4, 2026

(54) PARTICLE REMOVAL DURING FABRICATION OF ELECTROCHROMIC DEVICES

(71) Applicant: View, Inc., Milpitas, CA (US)

(72) Inventor: Robert T. Rozbicki, Saratoga, CA (US)

(73) Assignee: View Operating Corporation, San Jose, CA (US)

( * ) Notice: Subject to any disclaimer, the term of this patent is extended or adjusted under 35 U.S.C. 154(b) by 0 days.

(21) Appl. No.: 18/473,094

(22) Filed: Sep. 22, 2023

(65) Prior Publication Data

US 2024/0012306 A1　　Jan. 11, 2024

Related U.S. Application Data

(63) Continuation of application No. 16/868,455, filed on May 6, 2020, now Pat. No. 12,360,425, which is a
(Continued)

(51) Int. Cl.
　G02F 1/153　　　(2006.01)
　C23C 14/02　　　(2006.01)
　　　(Continued)

(52) U.S. Cl.
　CPC ............ G02F 1/153 (2013.01); C23C 14/021 (2013.01); C23C 14/028 (2013.01);
　　　(Continued)

(58) Field of Classification Search
　CPC .......... G02F 1/55; G02F 1/1533; G02F 1/525; G02F 1/3439
　See application file for complete search history.

(56) References Cited

U.S. PATENT DOCUMENTS 3,793,167 A　　2/1974　Glaser
4,340,278 A　　7/1982　Beni et al.
　　　(Continued)

FOREIGN PATENT DOCUMENTS

CN　　　1826423 A　　8/2006
CN　　　1961094 A　　5/2007
　　　(Continued)

OTHER PUBLICATIONS

Australian Examination Report dated Nov. 1, 2019 in AU Application No. 2018267645.
　　　(Continued)

*Primary Examiner* — Sharrief I Broome
*Assistant Examiner* — Journey F Sumlar
(74) *Attorney, Agent, or Firm* — Cha & Reiter, LLC

(57)　　　　ABSTRACT

Electrochromic devices are fabricated using a particle removal operation that reduces the occurrence of electronically conducting layers and/or electrochromically active layers from contacting layers of the opposite polarity and creating a short circuit in regions where defects form. In some embodiments, the particle removal operation is not a lithiation operation. In some embodiments, the particle removal operation is performed at an intermediate stage during the deposition of either an electrochromic layer or a counter electrode layer.

6 Claims, 11 Drawing Sheets

Related U.S. Application Data continuation of application No. 16/836,420, filed on Mar. 31, 2020, now Pat. No. 11,599,003, and a continuation of application No. 16/719,700, filed on Dec. 18, 2019, now abandoned, said application No. 16/836,420 is a continuation-in-part of application No. 16/209,514, filed on Dec. 4, 2018, now abandoned, said application No. 16/868,455 is a continuation of application No. 15/331,526, filed on Oct. 21, 2016, now abandoned, said application No. 16/209,514 is a continuation of application No. 15/086,438, filed on Mar. 31, 2016, now Pat. No. 10,288,969, which is a continuation of application No. 14/885,734, filed on Oct. 16, 2015, now Pat. No. 10,162,240, said application No. 15/331,526 is a continuation-in-part of application No. 14/885,734, filed on Oct. 16, 2015, now Pat. No. 10,162,240, said application No. 16/719,700 is a continuation of application No. 14/884,683, filed on Oct. 15, 2015, now Pat. No. 10,551,711, said application No. 15/331,526 is a continuation of application No. PCT/US2015/026150, filed on Apr. 16, 2015, said application No. 14/885,734 is a continuation of application No. 14/601,141, filed on Jan. 20, 2015, now Pat. No. 9,229,291, which is a continuation of application No. 13/763,505, filed on Feb. 8, 2013, now Pat. No. 9,007,674, which is a continuation-in-part of application No. PCT/US2012/057606, filed on Sep. 27, 2012, said application No. 14/884,683 is a continuation of application No. 12/645,111, filed on Dec. 22, 2009, now Pat. No. 9,664,974.

(60) Provisional application No. 61/982,427, filed on Apr. 22, 2014, provisional application No. 61/541,999, filed on Sep. 30, 2011, provisional application No. 61/165,484, filed on Mar. 31, 2009.

(51) Int. Cl.

| | |
|---|---|
| *C23C 14/06* | (2006.01) |
| *C23C 14/08* | (2006.01) |
| *C23C 14/34* | (2006.01) |
| *C23C 14/58* | (2006.01) |
| *G02F 1/13* | (2006.01) |
| *G02F 1/1333* | (2006.01) |
| *G02F 1/1523* | (2019.01) |
| *G02F 1/1524* | (2019.01) |
| *G02F 1/155* | (2006.01) |
| *H01J 37/32* | (2006.01) |
| *H01J 37/34* | (2006.01) |

(52) U.S. Cl.

CPC ...... *C23C 14/0635* (2013.01); *C23C 14/0652* (2013.01); *C23C 14/0676* (2013.01); *C23C 14/08* (2013.01); *C23C 14/081* (2013.01); *C23C 14/083* (2013.01); *C23C 14/086* (2013.01); *C23C 14/34* (2013.01); *C23C 14/588* (2013.01); *C23C 14/5886* (2013.01); *G02F 1/1309* (2013.01); *G02F 1/133345* (2013.01); *G02F 1/1523* (2013.01); *G02F 1/1524* (2019.01); *G02F 1/1533* (2013.01); *G02F 1/155* (2013.01); *H01J 37/32* (2013.01); *H01J 37/32733* (2013.01); *H01J 37/32853* (2013.01); *H01J 37/3417* (2013.01); *H01J 37/3429* (2013.01); *G02F 1/1316* (2021.01); *G02F 2001/1536* (2013.01); *G02F 2001/1555* (2013.01)

(56) References Cited

U.S. PATENT DOCUMENTS

| | | | | |
|---|---|---|---|---|
| 4,768,291 | A | 9/1988 | Palmer | |
| 4,854,675 | A | 8/1989 | Yamazaki et al. | |
| 4,983,880 | A | 1/1991 | Abdalla et al. | |
| 4,996,078 | A | 2/1991 | Langowski | |
| 5,364,666 | A | 11/1994 | Williams et al. | |
| 5,645,758 | A * | 7/1997 | Kawasumi | G02F 1/132 428/1.31 |
| 5,724,175 | A | 3/1998 | Hichwa et al. | |
| 5,738,767 | A * | 4/1998 | Coad | C03C 17/002 204/192.12 |
| 7,938,855 | B2 * | 5/2011 | Gregorich | A61F 2/06 623/1.46 |
| 7,942,926 | B2 * | 5/2011 | Benco | A61L 31/026 623/1.46 |
| 8,259,380 | B2 | 9/2012 | Valentin et al. | |
| 8,780,432 | B1 | 7/2014 | Nguyen | |
| 10,162,240 | B2 | 12/2018 | Rozbicki | |
| 10,831,077 | B2 | 11/2020 | Kailasam et al. | |
| 11,079,648 | B2 | 8/2021 | Rozbicki | |
| 2003/0047280 | A1 * | 3/2003 | Takayama | H10K 59/123 257/E27.111 |
| 2003/0227664 | A1 | 12/2003 | Agrawal et al. | |
| 2004/0121571 | A1 | 6/2004 | Uchikoshi et al. | |
| 2004/0123804 | A1 | 7/2004 | Yamazaki et al. | |
| 2004/0160538 | A1 | 8/2004 | Li et al. | |
| 2005/0003737 | A1 | 1/2005 | Montierth et al. | |
| 2005/0084776 | A1 * | 4/2005 | Kobayashi | G02B 5/201 430/7 |
| 2005/0195488 | A1 | 9/2005 | McCabe et al. | |
| 2006/0188661 | A1 * | 8/2006 | Hirai | H10K 71/135 427/256 |
| 2007/0009652 | A1 | 1/2007 | Manz et al. | |
| 2007/0097480 | A1 | 5/2007 | Yang et al. | |
| 2007/0138952 | A1 | 6/2007 | Liu et al. | |
| 2008/0308120 | A1 | 12/2008 | Watanabe et al. | |
| 2009/0057137 | A1 | 3/2009 | Pitts et al. | |
| 2009/0285976 | A1 | 11/2009 | Lochtman et al. | |
| 2010/0003883 | A1 | 1/2010 | Lee et al. | |
| 2010/0102310 | A1 | 4/2010 | Komatsu et al. | |
| 2010/0243427 | A1 | 9/2010 | Kozlowski et al. | |
| 2010/0245973 | A1 | 9/2010 | Wang et al. | |
| 2010/0267549 | A1 | 10/2010 | Finley | |
| 2011/0211247 | A1 | 9/2011 | Kozlowski et al. | |
| 2011/0261430 | A1 | 10/2011 | Mazurkiewicz et al. | |
| 2012/0033287 | A1 | 2/2012 | Friedman et al. | |
| 2012/0275008 | A1 | 11/2012 | Pradhan et al. | |
| 2013/0028051 | A1 | 1/2013 | Barkved et al. | |
| 2013/0092679 | A1 | 4/2013 | Rozbicki et al. | |
| 2013/0270105 | A1 | 10/2013 | Wang et al. | |
| 2014/0022621 | A1 | 1/2014 | Kailasam et al. | |
| 2015/0253642 | A1 | 9/2015 | Kalweit et al. | |
| 2016/0033840 | A1 | 2/2016 | Rozbicki | |
| 2016/0141258 | A1 | 5/2016 | Jain et al. | |
| 2016/0209722 | A1 | 7/2016 | Wang et al. | |
| 2017/0038658 | A1 | 2/2017 | Rozbicki | |
| 2018/0046053 | A1 | 2/2018 | Rozbicki | |
| 2018/0067370 | A1 | 3/2018 | Rozbicki | |
| 2018/0081250 | A1 | 3/2018 | Kailasam et al. | |
| 2019/0011797 | A1 | 1/2019 | Rozbicki | |
| 2020/0264487 | A1 | 8/2020 | Rozbicki | |

FOREIGN PATENT DOCUMENTS

| | | | |
|---|---|---|---|
| CN | 101415857 | A | 4/2009 |
| CN | 101563477 | A | 10/2009 |
| CN | 102544213 | A | 7/2012 |
| CN | 102666911 | A | 9/2012 |
| GB | 1318818 | A | 5/1973 |
| JP | S58163921 | A | 9/1983 |
| JP | S5961820 | A | 4/1984 |
| JP | 2012523018 | A | 9/2012 |
| JP | 2012194412 | A | 10/2012 |
| KR | 20140003783 | A | 1/2014 |
| TW | 200642785 | A | 12/2006 |

(56)                 References Cited

FOREIGN PATENT DOCUMENTS

| | | | |
|---|---|---|---|
| TW | 201413768 A | 4/2014 |
| WO | WO-2012174260 A2 | 12/2012 |
| WO | WO-2014004518 A1 | 1/2014 |
| WO | WO-2015164179 A1 | 10/2015 |
| WO | WO-2016033453 A1 | 3/2016 |
| WO | WO-2016081514 A1 | 5/2016 |

OTHER PUBLICATIONS

Australian Examination Report No. 2 dated Oct. 19, 2020 in AU Application No. 2018267645.
Australian Notice of Acceptance of Patent Application dated Oct. 27, 2020 in AU Application No. 2018267645.
Chinese Office Action dated Aug. 26, 2019 in CN Application No. 201580028134.7.
Chinese Office Action dated Dec. 24, 2018 in CN Application No. 201580028134.7.
Chinese Office Action dated Feb. 6, 2020 in CN Application No. 201580028134.7.
Chinese Reexamination Notification dated Aug. 4, 2021 in CN Application No. 201580028134.7.
CN Office Action dated Aug. 31, 2023, in application No. CN202210547519.6.
CN Office Action dated Feb. 18, 2022, in Application No. CN201580028134.7 with English Translation.
European Office Action dated Dec. 2, 2022 in Application No. EP20193204.3.
Extended European Search Report dated Oct. 27, 2017 issued in EP Application No. 15783393.0.
Extended European Search Report dated Oct. 27, 2020 issued in EP Application No. 20193204.3.
IN Office Action dated Jul. 27, 2022, in Application No. IN202238015521.
Indian Office Action dated Jun. 3, 2020 in Indian Patent Application No. 201637036596.
Intention to Grant dated Jul. 13, 2020 issued in EP Application No. 15783393.0.
Intention to Grant dated Oct. 1, 2020 issued in EP Application No. 15783393.0.
International Preliminary Report on Patentability dated Nov. 3, 2016 issued in PCT/US15/26150.
International Search Report and Written Opinion dated Jul. 7, 2015, issued in PCT/US15/26150.
KR Office Action dated Apr. 4, 2023, in Application No. KR10-2022-7027548 with English translation.
TW Office Action dated Apr. 22, 2019 in TW Application No. 107111517.
TW Office Action dated Mar. 2, 2021 in TW Application No. 109110462 with Enaglish Translation of Search Report.
"Supersonic." Merriam-Webster.com Dictionary, Merriam-Webster, hhttps://www.merian-webster.com/dictionary/supersonic. Accessed Nov. 17, 2020. (Year: 2020).
U.S Advisory Action dated Oct. 10, 2023 in U.S. Appl. No. 15/799,694.

U.S. Examiner's Answer to Appeal Brief Before the Patent Trial and Appeal Board on Dec. 7, 2022 in U.S. Appl. No. 15/716,242.
U.S. Final Office Action dated Aug. 22, 2023, in U.S. Appl. No. 15/716,242.
US Final Office Action dated Dec. 30, 2019 for U.S. Appl. No. 15/799,694.
US Final Office Action dated Feb. 23, 2021 for U.S. Appl. No. 15/799,694.
US Final Office Action dated Feb. 28, 2020 for U.S. Appl. No. 15/716,242.
US Final Office Action dated Jan. 26, 2018 for U.S. Appl. No. 14/885,734.
U.S. Final Office Action dated Jul. 19, 2022, in U.S. Appl. No. 15/799,694.
U.S. Final Office Action dated May 5, 2023 in U.S. Appl. No. 15/799,694.
US Final Office Action dated May 28, 2021 for U.S. Appl. No. 15/716,242.
US Final Office Action dated Nov. 18, 2019 for U.S. Appl. No. 15/794,805.
US Final Office Action dated Nov. 20, 2020 for U.S. Appl. No. 15/716,242.
US Final Office Action dated Nov. 29, 2018 for U.S. Appl. No. 15/799,694.
US Final Office Action dated Sep. 3, 2019 for U.S. Appl. No. 15/331,526.
U.S. Non-Final Office Action dated Nov. 25, 2022 in U.S. Appl. No. 15/799,694.
US Non-Final Office Action dated Oct. 1, 2021, in U.S. Appl. No. 15/799,694.
U.S. Non-Final Office Action dated Oct. 6, 2022, in U.S. Appl. No. 16/868,455.
US Notice of Allowance dated Jul. 13, 2020 for U.S. Appl. No. 16/118,320.
U.S. Notice of Allowance dated Jun. 22, 2023, in U.S. Appl. No. 16/868,455.
US Notice of Allowance dated Mar. 26, 2021 for U.S. Appl. No. 15/794,805.
US Notice of Allowance dated Sep. 24, 2018 for U.S. Appl. No. 14/885,734.
US Office Action dated Apr. 18, 2019 for U.S. Appl. No. 15/799,694.
US Office Action dated Dec. 10, 2019 for U.S. Appl. No. 15/716,242.
US Office Action dated Jan. 1, 2021 for U.S. Appl. No. 15/794,805.
US Office Action dated Jan. 9, 2020 for U.S. Appl. No. 16/118,320.
US Office Action dated Jun. 11, 2020 for U.S. Appl. No. 15/794,805.
US Office Action dated Jun. 15, 2020, for U.S. Appl. No. 15/331,526.
US Office Action dated Mar. 26, 2018 for U.S. Appl. No. 15/799,694.
US Office Action dated Mar. 7, 2019 for U.S. Appl. No. 15/794,805.
US Office Action dated May 15, 2020 for U.S. Appl. No. 15/799,694.
US Office Action dated Oct. 5, 2018 for U.S. Appl. No. 15/331,526.
U.S. Office Action for U.S. Appl. No. 14/885,734 dated Jan. 19, 2017.
U.S. Office Action for U.S. Appl. No. 14/885,734 dated Jul. 14, 2017.

* cited by examiner

489

487

485

483

481

521

Start

Receive Substrate with TC Layer — 503

Wash and Prepare for Device Fabrication — 505

Deposit First Electrocromic Layer — 507

Lithiate (Optional) — 509

Deposit Second Electrochromic Layer — 511

Particle Removal — 512

Lithiate — 513

Deposit second TC Layer — 515

Post Treatment (Thermal Conditioning) — 517

Done

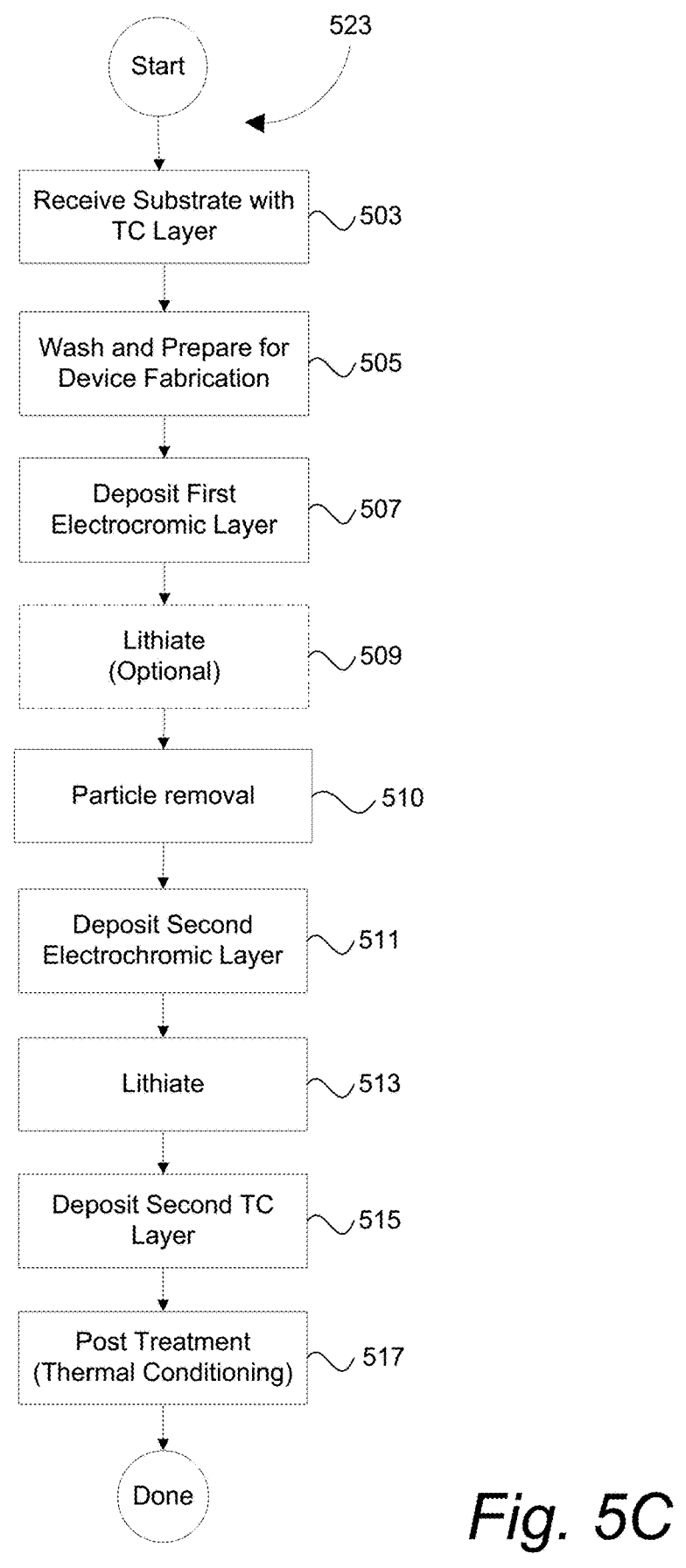

523

Start

Receive Substrate with TC Layer ⟋503

Wash and Prepare for Device Fabrication ⟋505

Deposit First Electrocromic Layer ⟋507

Lithiate (Optional) ⟋509

Particle removal ⟋510

Deposit Second Electrochromic Layer ⟋511

Lithiate ⟋513

Deposit Second TC Layer ⟋515

Post Treatment (Thermal Conditioning) ⟋517

Done

*Fig. 5C*

PARTICLE REMOVAL DURING FABRICATION OF ELECTROCHROMIC DEVICES

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Electrochromism is a phenomenon in which a material exhibits a reversible electrochemically-mediated change in an optical property when placed in a different electronic state, typically by being subjected to a voltage change. The optical property is commonly one or more of color, transmittance, absorbance, and reflectance. Electrochromic materials may be incorporated into, for example, windows and mirrors. The color, transmittance, absorbance, and/or reflectance of such windows and mirrors may be changed by inducing a change in the electrochromic material. However, advances in electrochromic technology, apparatus, and related methods of making and/or using them, are needed because conventional electrochromic windows suffer from, for example, high defectivity and low versatility.

SUMMARY

Disclosed herein is an electrochromic device design and process for producing electrochromic devices. In some embodiments, the methods employ a particle removal operation which reduces the likelihood that electronically conducting layers and/or electrochromically active layers will contact layers of the opposite polarity and creating a short circuit in regions where defects form. In some embodiments, the particle removal operation is not a lithiation operation. In some embodiments, the particle removal operation is performed at an intermediate stage during the deposition of either an electrochromic layer or a counter electrode layer.

One aspect of the disclosure concerns methods of fabricating an electrochromic device, which methods may be characterized by: (a) providing a substrate having a first transparent electronically conductive layer comprising a first transparent electronically conductive material; (b) forming an electrochromic stack over the substrate having the first transparent electronically conductive layer; (c) forming a second transparent electronically conductive layer over the electrochromic stack, the second transparent electronically conductive layer including a second transparent electronically conductive material, whereby the first and second transparent electronically conductive layers sandwich the electrochromic stack; and (d) performing a particle-removal operation to reduce the number of defects in the formed electrochromic device, wherein the particle-removal operation is performed at any time before both the electrochromic layer and the counter electrode layer are fully-formed. Forming the stack may include the following operations: (i) forming an electrochromic layer comprising an electrochromic material; and (ii) forming a counter electrode layer comprising a counter electrode material.

In some implementations, the particle-removal operation is performed before starting to form either the electrochromic or counter electrode layers. In other implementations, the particle-removal operation is performed after the electrochromic layer is formed but before starting to form the counter electrode layer. In still other implementations, the particle-removal operation is performed after the counter electrode layer is formed but before starting to form the electrochromic layer. Still further, the particle-removal operation may be performed after starting to form the electrochromic layer but before the electrochromic layer is fully formed. Still further, the particle-removal operation is performed after starting to form the counter electrode layer but before the counter electrode layer is fully formed.

In some embodiments, the particle removal operation reduces the number of visible short-related pinhole in the formed electrochromic device. Some examples of the particle-removal operation include contact cleaning, irradiation, heat treatment, plasma treatment, contact with supercritical fluid, acoustic vibration, and contact with flowing ionized air.

In some examples where the particle-removal operation includes contact cleaning, the contact cleaning removes particles from the surface of the partially-formed electrochromic device by static electricity and/or adhesion. For example, the contact cleaning may involve contacting the surface of the partially-formed electrochromic device with one or more rollers, strips, or brushes.

In some cases, the particle-removal operation involves irradiating the surface of the partially-formed electrochemical device. The irradiation may produce a volumetric expansion of the particles to be removed relative to the surrounding portions of the partially-formed electrochromic device such that these particles are ejected from the surface of the partially-formed electrochromic device.

In certain embodiments, the particle-removal operation includes contacting the surface of the partially-formed electrochromic device with a plasma. As an example, the plasma contact produces a build-up of electrical charge in the particles to be removed, and then the particles are ejected by applying a voltage to an outer surface of the partially-formed electrochromic device. In some implementations, the plasma is a fluorine and/or oxygen plasma which etches away a film from the surface of the partially-formed electrochromic device such that particles are dislodged and/or removed with the film.

In certain embodiments, the particle-removal operation includes a heat treatment of the partially-formed electrochromic device. The heat treatment may involve heating the particles to be removed so as to cause the particles to volumetrically expand relative to the surrounding portions of the partially-formed electrochromic device and thereby eject the particles from the surface of the partially-formed electrochromic device. In some implementations, the heat-treatment includes a heating technique selected from: irradiation with UV light, proximity to a resistive heating element, and exposure to a heated gas.

In another example, the particle-removal operation includes dislodging or burning away particles from the surface of the partially-formed electrochromic device with laser radiation. In some cases, the laser radiation is collimated into a flat beam which grazes the surface of the partially-formed electrochromic device. In some examples, the laser radiation is raster-scanned over the surface of the partially-formed electrochromic device.

In certain embodiments, the electrochromic material of the electrochromic layer is cathodically-coloring, and the counter electrode material of the counter electrode layer is anodically-coloring. In some examples, the electrochromic layer is formed before forming the counter electrode layer.

In such processes, the cathodically-coloring electrochromic material may include a tungsten oxide, and the anodically-coloring electrochromic material may include a nickel tungsten oxide. In some examples, the method of forming the electrochromic layer includes forming an additional layer containing tungsten oxide having a different tungsten to oxygen ratio than the tungsten oxide comprising the other cathodically-coloring electrochromic material.

In some implementations, the method additionally includes depositing lithium into the electrochromic stack. In some cases, the first transparent electronically conductive material is selected from fluorinated tin oxide and indium-doped tin oxide, and the second transparent electronically conductive material is an indium-doped tin oxide.

In some implementations, the electrochromic stack is formed on the substrate while the substrate is oriented vertically. In some implementations, the electrochromic stack is formed on the substrate while the substrate is oriented horizontally.

Another aspect of the disclosed embodiments concerns apparatus for fabricating an electrochromic device. Such apparatus may be characterized by the following features: (a) an integrated deposition system for forming an electrochromic stack on a substrate, and (b) a controller including instructions for (i) passing the substrate through the integrated deposition system and (ii) operating a particle-removal device to remove particles from the surface of the substrate and/or the surface of the electrochromic stack before it is fully-formed. The integrated deposition system includes (i) a first deposition station containing a first target comprising a first material for depositing a layer of an electrochromic material on a substrate when the substrate is positioned in the first deposition station; (ii) a second deposition station containing a second target comprising a second material for depositing a layer of a counter electrode material on the substrate when the substrate is positioned in the second deposition station; and (iii) the particle-removal device for removing particles from the surface of the substrate and/or the surface of the electrochromic stack before it is fully-formed. The instructions for passing the substrate through the deposition system contain instructions for passing the substrate through the first and second deposition stations in a manner that sequentially deposits a stack on the substrate, the stack comprising the layer of electrochromic material and the layer of counter electrode material In some designs, the integrated deposition system further includes (iv) a third deposition station containing a third target comprising a third material. The third deposition station is configured to deposit an electrode layer on the electrochromic stack when the substrate having the electrochromic stack is positioned in the third deposition station. The electrode layer may include a transparent electronically conductive material.

The apparatus may additionally include a substrate holder configured to provide the substrate in a vertical orientation when positioned for deposition in the first and second deposition stations. In some cases, the apparatus is configured to provide the substrate in a vertical orientation when positioned at the particle-removal device.

In some embodiments, the apparatus additionally includes a substrate holder configured to provide the substrate in a horizontal orientation when positioned for deposition in the first and second deposition stations. In some implementations, the apparatus is further configured to provide the substrate in a horizontal orientation when positioned at the particle-removal device.

In certain embodiments, the program instructions include instructions for operating the particle-removal device to remove particles before the layer of electrochromic material is fully-formed. In other embodiments, the program instructions include instructions for operating the particle-removal device to remove particles before the counter electrode layer is fully formed.

In some designs, the operation of the particle-removal device reduces the number of visible short-related pinhole defects in the fabricated electrochromic device to a level no greater than about 0.005 per square centimeter.

These and other features and advantages of the disclosed embodiments will be described in more detail below with reference to the associate drawings.

BRIEF DESCRIPTION OF THE FIGURES

FIGS. 5B and 5C are flow charts of processes that incorporate particle removal operations at specified stages in the sequence of device fabrication operations.

DETAILED DESCRIPTION

The present disclosure concerns methods and apparatus for reducing difficulties created by defects in electrochromic devices. Certain types of defects introduce short circuits across the electrochromic device electrodes that produce particularly unattractive blemishes in electrochromic products. Despite efforts to clean and remove particulates on substrates prior to fabrication of electrochromic devices thereon, some particles are formed as a part of the fabrication process, e.g., during sputter deposition particulates can be formed from various hardware in the sputter environment. Spurious particles can deposit onto the substrate during movement through and between sputter environments. This is especially true of horizontally oriented substrates. Vertical orientation of the substrate helps to reduce such deposition, but still some particles contaminate the substrate during fabrication nonetheless. Various disclosed embodiments concern the use of a particle removal operation during fabrication of the electrochromic device stack. This additional operation serves to prevent formation of a short circuit if a particle has been ejected from the device stack during fabrication. The problem of shorting associated with particle ejection is described below in the context of FIGS. 3A-3D. In certain embodiments, the particle-removal operation is performed at any time before both of the electrochromic layer and the counter electrode layer are fully-formed.

Electrochromic Devices—Examples

Figure 1A:
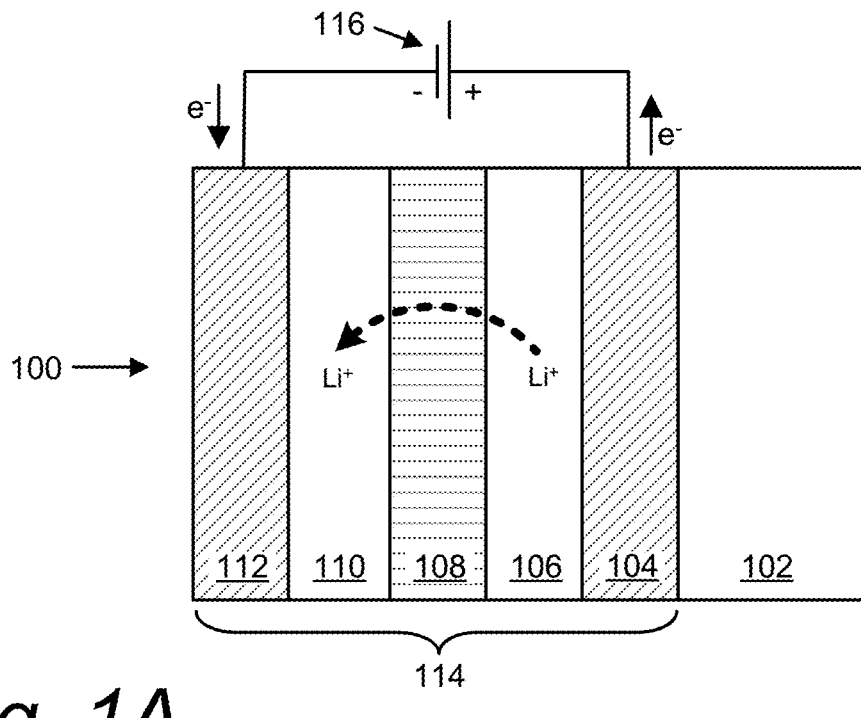
FIGS. 1A and 1B depict the structure and function of electrochromic devices.
Figure 1B:
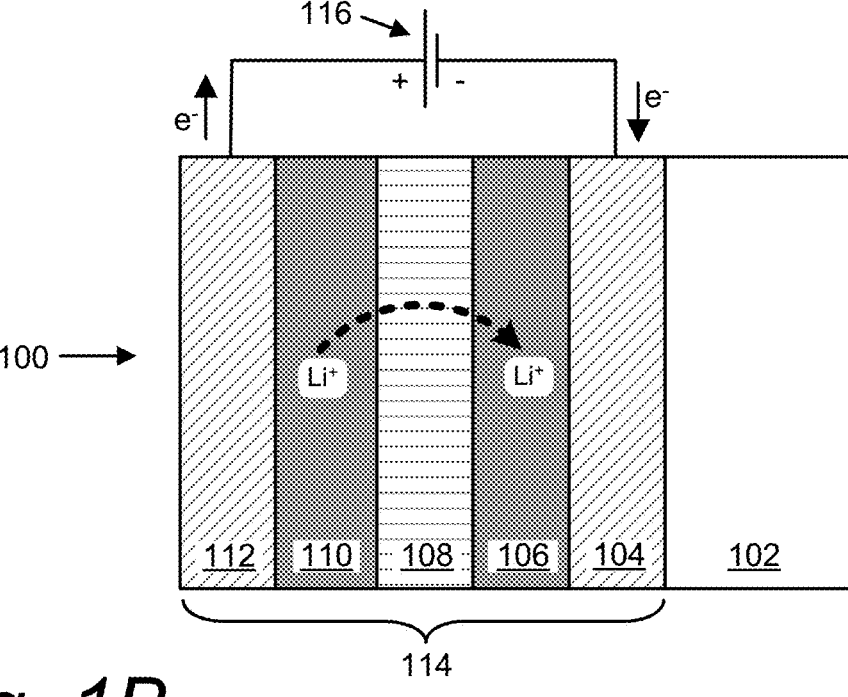

Before turning to a more detailed description of particle removal techniques and processes incorporating such techniques, examples of electrochromic device structure and fabrication will be presented. FIGS. 1A and 1B are schematic cross-sections of an electrochromic device, 100, showing a common structural motif for such devices. Electrochromic device 100 includes a substrate 102, a conductive layer (CL) 104, an electrochromic layer (EC) 106, an optional ion conducting (electronically resistive) layer (IC) 108, a counter electrode layer (CE) 110, and another conductive layer (CL) 112. Elements 104, 106, 108, 110, and 112 are collectively referred to as an electrochromic stack, 114. A voltage source, 116, operable to apply an electric potential across electrochromic stack 112 effects the transition of the electrochromic device from, e.g., a bleached state (refer to FIG. 1A) to a colored state (refer to FIG. 1B).

The order of layers may be reversed with respect to the substrate. That is, the layers may be in the following order: substrate, conductive layer, counter electrode layer, ion conducting layer, electrochromic material layer, and conductive layer. The counter electrode layer may include a material that is electrochromic or not. If both the electrochromic layer and the counter electrode layer employ electrochromic materials, one of them should be a cathodically coloring material and the other should be an anodically coloring material. For example, the electrochromic layer may employ a cathodically coloring material and the counter electrode layer may employ an anodically coloring material. This is the case when the electrochromic layer is a tungsten oxide and the counter electrode layer is a nickel tungsten oxide.

The conductive layers commonly comprise transparent conductive materials, such as metal oxides, alloy oxides, and doped versions thereof, and are commonly referred to as "TCO" layers because they are made from transparent conducting oxides. In general, however, the transparent layers can be made of any transparent, electronically conductive material that is compatible with the device stack. Some glass substrates are provided with a thin transparent conductive oxide layer such as fluorinated tin oxide, sometimes referred to as "TEC."

Device 100 is presented for illustrative purposes only, in order to facilitate understanding of the context of embodiments described herein. Methods and apparatus described herein are used to identify and reduce defects in electrochromic devices, regardless of the structural arrangement of the electrochromic device.

During normal operation, an electrochromic device such as device 100 reversibly cycles between a bleached state and a colored state. As depicted in FIG. 1A, in the bleached state, a potential is applied across the electrodes (transparent conductor layers 104 and 112) of electrochromic stack 114 to cause available ions (e.g. lithium ions) in the stack to reside primarily in the counter electrode 110. If electrochromic layer 106 contains a cathodically coloring material, the device is in a bleached state. In certain electrochromic devices, when loaded with the available ions, counter electrode layer 110 can be thought of as an ion storage layer.

Referring to FIG. 1B, when the potential on the electrochromic stack is reversed, the ions are transported across ion conducting layer 108 to electrochromic layer 106 and cause the material to enter the colored state. Again, this assumes that the optically reversible material in the electrochromic device is a cathodically coloring electrochromic material. In certain embodiments, the depletion of ions from the counter electrode material causes it to color also as depicted. In other words, the counter electrode material is anodically coloring electrochromic material. Thus, layers 106 and 110 combine to synergistically reduce the amount of light transmitted through the stack. When a reverse voltage is applied to device 100, ions travel from electrochromic layer 106, through the ion conducting layer 108, and back into counter electrode layer 110. As a result, the device bleaches.

Some pertinent examples of electrochromic devices are presented in the following US patent applications, each incorporated by reference in its entirety: U.S. patent application Ser. No. 12/645,111, filed Dec. 22, 2009; U.S. patent application Ser. No. 12/772,055, filed Apr. 30, 2010; U.S. patent application Ser. No. 12/645,159, filed Dec. 22, 2009; U.S. patent application Ser. No. 12/814,279, filed Jun. 11, 2010; U.S. patent application Ser. No. 13/462,725, filed May 2, 2012; and U.S. patent application Ser. No. 13/763,505, filed Feb. 8, 2013.

Electrochromic devices such as those described in relation to FIGS. 1A and 1B are used in, for example, electrochromic windows. For example, substrate 102 may be architectural glass upon which electrochromic devices are fabricated. Architectural glass is glass that is used as a building material. Architectural glass is typically used in commercial buildings, but may also be used in residential buildings, and typically, though not necessarily, separates an indoor environment from an outdoor environment. In certain embodiments, architectural glass is at least 20 inches by 20 inches, and can be much larger, e.g., as large as about 72 inches by 120 inches.

As larger and larger substrates are used for electrochromic windows it is desirable to minimize defects in the electrochromic device, because otherwise the performance and visual quality of the electrochromic windows will suffer. The embodiments described herein may mitigate defectivity in electrochromic windows.

In some embodiments, electrochromic glass is integrated into an insulating glass unit (IGU). An insulating glass unit includes multiple glass panes assembled into a unit, generally with the intention of maximizing the thermal insulating properties of a gas contained in the space formed by the unit while at the same time providing clear vision through the unit. Insulating glass units incorporating electrochromic glass are similar to insulating glass units currently known in the art, except for electrical terminals for connecting the electrochromic glass to voltage source.

Defectivity in Electrochromic Devices

As used herein, the term "defect" refers to a defective point or region of an electrochromic device. Typically, defects are electrical shorts or pinholes. Further, defects may be characterized as visible or non-visible. In general, a defect in an electrochromic device, and sometimes an area around the defect, does not change optical state (e.g., color) in response to an applied potential that is sufficient to cause non-defective regions of the electrochromic device to color or otherwise change optical state. Often a defect will be manifest as visually discernible anomalies in the electrochromic window or other device. Such defects are referred to herein as "visible" defects. Other defects are so small that they are not visually noticeable to the observer in normal use (e.g., such defects do not produce a noticeable light point or "pinhole" when the device is in the colored state during daytime).

A short is a localized electronically conductive pathway spanning the ion conducting layer (e.g., an electronically conductive pathway between the two transparent conducting layers). Typically, a defect causing a visible short will have a physical dimension on the order of tens micrometers, sometimes less, which is a relatively small defect from a visual perspective. However, these relatively small defects result in a visual anomaly, the "halo", in the colored electrochromic window that are, for example, about 1 centimeter in diameter, sometimes larger. Halos can be reduced significantly by isolating the defect, for example by circumscribing the defect via a laser scribe or by ablating the material directly without circumscribing it. For example, a circular, oval, triangular, rectangular, or other shaped perimeter is ablated around the shorting defect thus electrically isolating it from the rest of the functioning device. The circumscription may be only tens, a hundred, or up to a few hundred micrometers in diameter. By circumscribing, and thus electrically isolating the defect, the visible short will resemble only a small point of light to the naked eye when the window is colored and there is sufficient light on the other side of the window. When ablated directly, without circumscription, there remains no EC device material in the area where the electrical short defect once resided. Rather, there is a hole through the device and at the base of the hole is, for example, the float glass or the diffusion barrier or the lower transparent electrode material, or a mixture thereof. Since these materials are all transparent, light may pass through the base of the hole in the device. Depending on the diameter of a circumscribed defect, and the width of the laser beam, circumscribed pinholes may also have little or no electrochromic material remaining within the circumscription (as the circumscription is typically, though not necessarily, made as small as possible). Such mitigated short defects manifest as pin points of light against the colored device, thus these points of light are commonly referred to as "pinholes." Isolation of an electrical short by circumscribing or direct ablation would be an example of an intentionally-made pinhole formed to convert a halo into a much smaller visual defect. Pinholes may also arise as a natural result of defects in the optical device, e.g. where a particle embedded in the complete device pops off to remove a portion of the device where there are no associated electrical shorts across the device electrodes. In either case, they are to be avoided if possible.

A pinhole is a region where one or more layers of the electrochromic device are missing or damaged so that electrochromism is not exhibited. Pinholes are not electrical shorts, and, as described above, they may be the result of mitigating an electrical short in the device. In certain embodiments, a pinhole has a defect dimension of between about 25 micrometers and about 300 micrometers, typically between about 50 micrometers and about 150 micrometers, thus it is much harder to discern visually than a halo. Typically, in order to reduce the visible perception of pinholes resulting from mitigation of halos, one will limit the size of a purposely-created pinhole to about 100 micrometers or less.

In some cases, an electrical short is created by a conductive particle lodging in and/or across the ion conducting layer, thereby causing an electronic path between the counter electrode layer and the electrochromic layer or the transparent conducting layer associated with either one of them. A defect may also be caused by a particle on the substrate on which the electrochromic stack is fabricated. When such a particle causes layer delamination due to stresses imparted by the particle, this is sometimes called "pop-off." In other instances, the layers do not adhere to the substrate properly and delaminate, interrupting the flow of ions and/or electrical current within the device. These types of defects are described in more detail below in relation to FIGS. 2 and 3A-3D. A delamination or pop-off defect can lead to a short if it occurs before a transparent conducting layer or associated EC or CE layer is deposited. In such cases, the subsequently deposited transparent conducting layer or EC/CE layer will directly contact an underlying transparent conducting layer or CE/EC layer providing direct electronic conductive pathway. A few examples of defect sources are presented in the table below. The table below is intended to provide examples of mechanisms that lead to the different types of visible and non-visible defects. It is not exhaustive. Additional factors exist which may influence how the EC window responds to a defect within the stack.

| Particle Location | Worst Case Failure | Effect |
|---|---|---|
| on substrate | pops off leaving pinhole | pinhole |
| on first Transparent conductive layer | pops off allowing TCL-TCL short | visible short voltage drop |
| on EC layer | pops off allowing TCL-EC-TCL short | visible short voltage drop |
| on IC layer | pops off leaving pinhole | pinhole |
| on CE layer | pops off leaving pinhole | pinhole |

It is believed that problematic shorts are frequently those in which a particle contacts the partially fabricated device before, during, or immediately after a first electrochromic layer is deposited on a substrate, and then remains in place until immediately before, during or after deposition of the second transparent conductive layer. As explained more fully below, such shorts may be the result of particles attached to the substrate upon entry into the electrochromic deposition chamber, or particles that become attached during deposition of a cathodic electrochromic layer such as a layer of tungsten oxide or become attached immediately after deposition of the first electrochromic layer but before any substantial amount of the next electrochromic layer is deposited. As explained, the substrate may or may not have a transparent conductive layer provided thereon when the substrate enters the deposition apparatus. Problematic shorts may also be introduced by particles that contact the partially fabricated device during lithiation, such as lithiation performed after or during deposition of the second electrochromic layer. As noted above, in the case of a visible short the defect will appear as a light central region (when the device is in the colored state) with a diffuse boundary such that the device gradually darkens with distance from the center of the short. If there are a significant number of electrical shorts (visible or non-visible) concentrated in an area of an electrochromic device, they may collectively impact a broad region of the device whereby the device cannot switch in such region. This is because the potential difference between the EC and CE layers in such regions cannot attain a threshold level required to drive ions across the ion conductive layer. It should be understood that leakage current may result from sources other than short-type defects. Such other sources include broad-based leakage across the ion conducting layer and edge defects such as roll off defects and scribe line defects. The emphasis here is on leakage caused only by points of electrical shorting across the ion conducting layer in the interior regions of the electrochromic device. These shorts cause visible defects that should be minimized for the electrochromic pane to be acceptable for use in an electrochromic window. Conventionally, the visual defects are identified and mitigated after device fabrication, e.g. prior to assembly of the pane into an IGU, in an IGU prior to installation of the IGU in an architectural façade or after installation of the IGU using a portable defect mitigation apparatus (e.g. as described in U.S. patent application Ser. No. 13/610,612 filed Sep. 14, 2011 and Ser. No. 13/859,623 filed Apr. 9, 2013, both incorporated herein by reference in their entireties). However, these are time consuming procedures and thus add expense which is to be avoided if possible. Embodiments described herein reduce particles and thus particle-related defects during fabrication of the electrochromic device, which allows for less post-fabrication mitigation.

Figure 2:
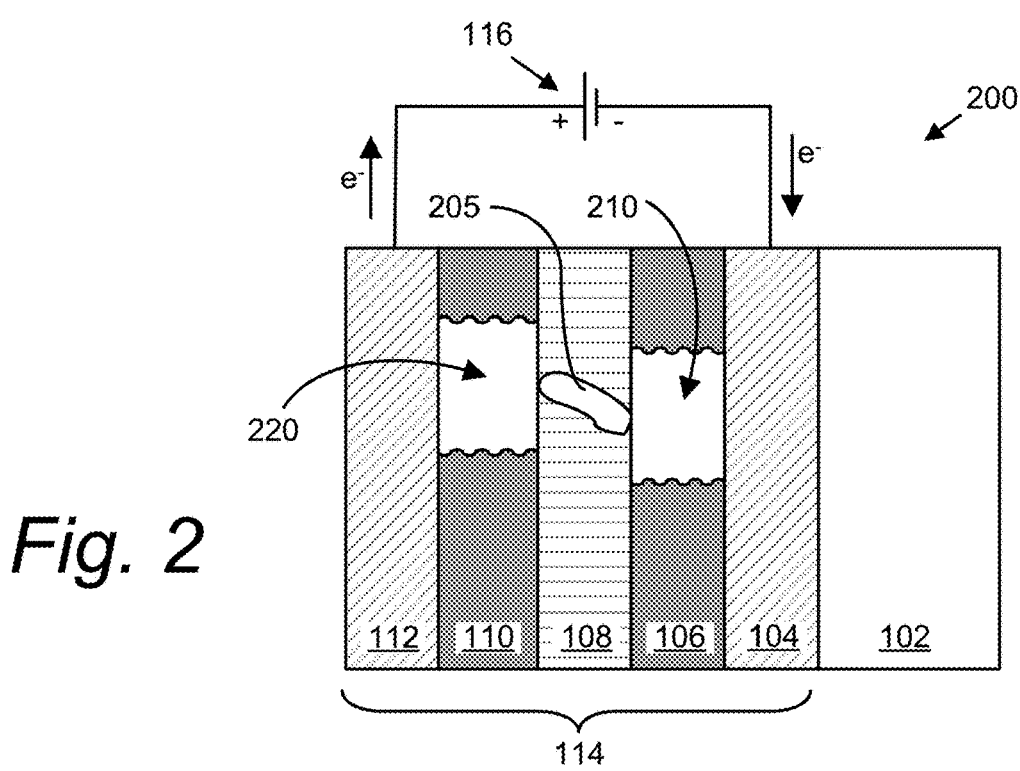
FIG. 2 depicts a particle defect in an electrochromic device.

FIG. 2 is a schematic cross-section of an electrochromic device, 200, with a particle, 205, in the ion conducting layer causing a localized defect in the device. In this example, electrochromic device 200 includes the same layers as described in relation to FIGS. 1A and 1B. Voltage source 116 is configured to apply a potential to electrochromic stack 114 as described above, through suitable connections (e.g., bus bars) to conductive layers 104 and 112.

In this example, ion conducting layer 108 includes a conductive particle, 205, or other artifact causing a defect. Conductive particle 205 results in a short between electrochromic layer 106 and counter electrode layer 110. In this example, particle 205 spans the thickness of the IC layer 108. Particle 205 physically impedes the flow of ions between electrochromic layer 106 and counter electrode layer 110, and also, due to its electrical conductivity, allows electrons to pass locally between the layers, resulting in a transparent region 210 in electrochromic layer 106 and a transparent region 220 in counter electrode layer 110. Transparent region 210 exists when the remainder of layers 110 and 106 are in the colored state. That is, if electrochromic device 200 is in the colored state, conductive particle 205 renders regions 210 and 220 of the electrochromic device unable to enter into the colored state. Sometimes such visible defect regions are referred to as "constellations" or "halos" because they appear as a series of bright spots (or stars) against a dark background (the remainder of the device being in the colored state). Humans will naturally direct their attention to the halos and often find them distracting or unattractive. Embodiments described herein reduce such visible defects. Pinhole defects may or may not be deemed worthy of repair, as they can be nearly indiscernible to the naked eye by most observers.

As mentioned above, visible short defects can also be caused by particles popping off, e.g. during or after fabrication of the electrochromic device, thereby creating damaged areas in the electrochromic stack, through one or more layers of the stack. Pop-off defects are described in more detail below.

Figure 3A:
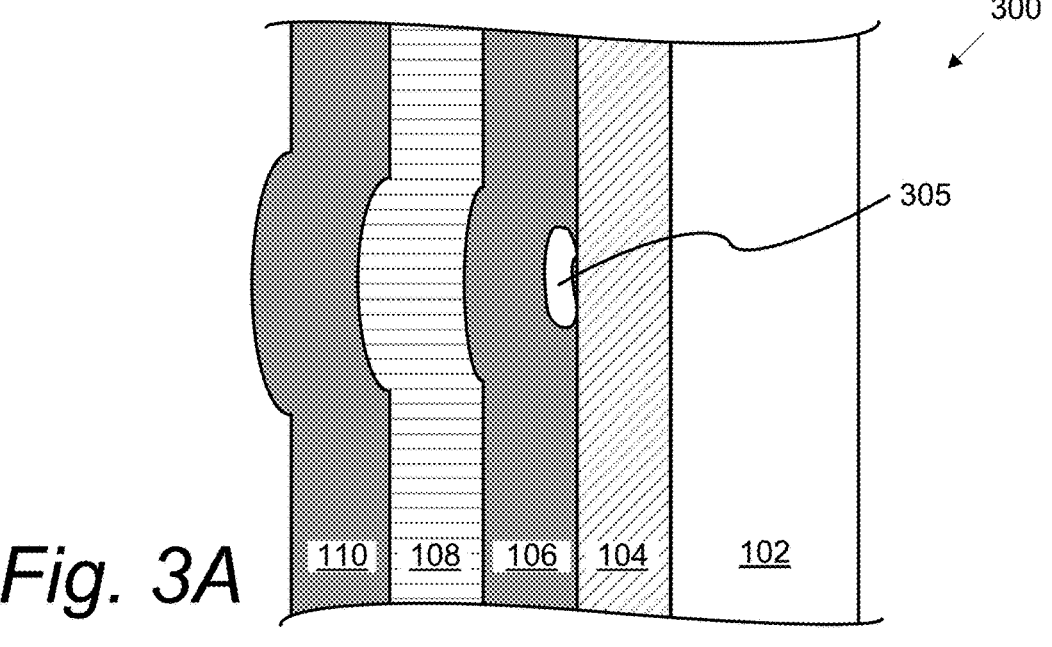
FIGS. 3A-3D depict aspects of formation and remediation of a pop-off defect.

FIG. 3A is a schematic cross-section of an electrochromic device, 300, with a particle 305 or other debris on conductive layer 104 prior to depositing the remainder of the electrochromic stack. Electrochromic device 300 includes the same components as electrochromic device 100. Particle 305 causes the layers in the electrochromic stack 114 to bulge in the region of particle 305, due to conformal layers 106-110 being deposited sequentially over particle 305 as depicted (in this example, conductive layer 112, e.g. TCO, has not yet been deposited). While not wishing to be bound by a particular theory, it is believed that layering over such particles embedded within the device layers, given the relatively thin and conformal nature of these layers, can cause stress in the area where the bulges are formed. More particularly, in each layer, around the perimeter of the bulged region, there can be defects in the layer, e.g. in the lattice arrangement or on a more macroscopic level, cracks or voids. One consequence of these defects may be, for example, an electrical short between electrochromic layer 106 and counter electrode layer 110 and/or loss of ion conductivity in layer 108. When the particle is larger, roll off of deposited layers, particularly TCO materials, under the particle is another potential source of shorting. These defects are not depicted in FIG. 3A, however.

Figure 3B:
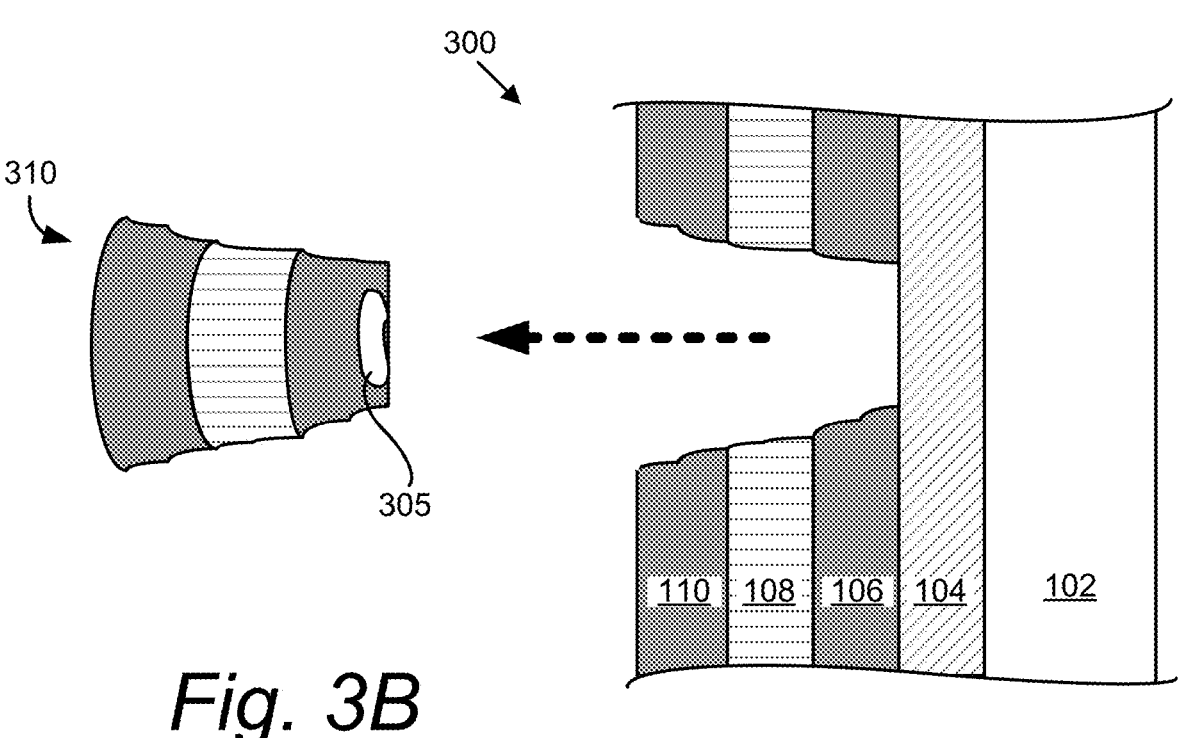
Figure 3C:
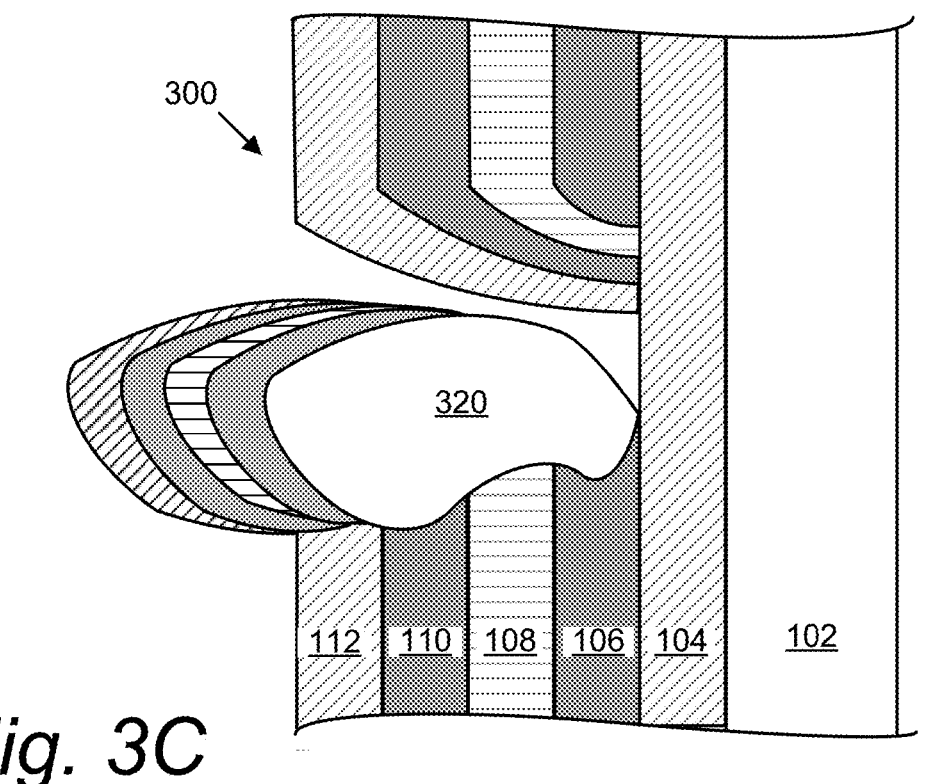

Referring to FIG. 3B, another consequence of defects caused by particle 305 is called a "pop-off." In this example, prior to deposition of conductive layer 112, a portion above the conductive layer 104 in the region of particle 305 breaks loose, carrying with it portions of electrochromic layer 106, ion conducting layer 108, and counter electrode layer 110. The "pop-off" is piece 310, which includes particle 305, a portion of electrochromic layer 106, as well as ion conducting layer 108 and counter electrode layer 110. The result is an exposed area of conductive layer 104 at the bottom of the trench left when piece 310 popped out of the layered stack of materials. It is believed that certain process operations tend to promote pop-offs. For example expansion and contraction of the material layers may promote pop-offs due to associated stress in the material layers. It is believed that lithium intercalation into the layers can induce stress in the layers. FIG. 3C depicts a "large" format particle 320 formed in stack 300. Such a particle spans the thickness of multiple layers (in this example electrochromic layer 106, ion conducting layer 108, and counter electrode layer 110). While portions of layers 106, 108, and 110 form on top of particle 320, they effectively form part of the particle itself. Particle 320 protrudes above the top of the layers during deposition, including protruding above layer 110. In some cases, particle 320 naturally pops off without the application of a particle ejection promoting step such as lithiation. In other cases, particle 320 is removed by use of a particle removal operation purposely applied to remove particles. Examples of such operations are described below and include contact adhesion techniques, electrostatic approaches, and thermal or pressure treatments, as well as lithiation, the latter serving to supply the device with lithium ions and also to induce stress in the device layers in order to remove particles.

In some cases, a short type defect is produced underneath an overhanging area of particle 320. Such defect may result from roll-off of the subsequently deposited layers, one after the other. For example, the first electrochromic layer 106 may extend only a limited distance under the particle overhang, while ion conducting layer 108 extends a little further under the overhang, counter electrode 110 extends still a little further, and finally, the second transparent conductive layer extends ever further, such that its edge contacts the underlying first transparent conductive layer, see FIG. 3C. This conductive layer to conductive layer contact produces a short-type defect. The short exists regardless of whether particle 320 ever pops off or is otherwise dislodged. In such instances, this electrical shorting type defect would have to be circumscribed by laser to isolate the short and thereby remove the halo effect and leave a pinhole defect.

Figure 3D:
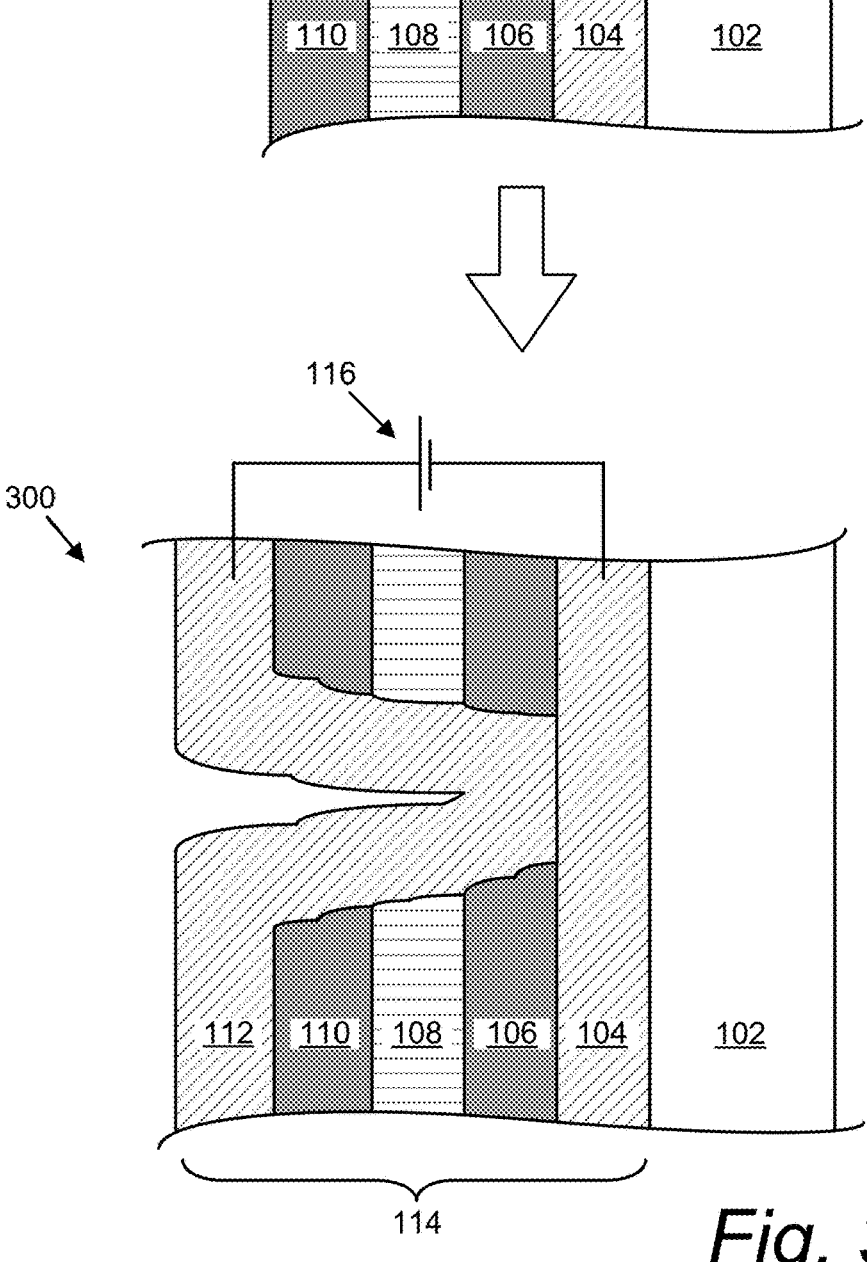

Referring to FIG. 3D, after pop-off an open trench, 350, exists in the device stack. Once conductive layer 112 is deposited, an electrical short is formed where conductive layer 112 comes in contact with conductive layer 104. This electrical short would leave a transparent region in electrochromic device 300 when it is in the colored state, similar in appearance to the visual defect created by the short described above in relation to FIG. 2.

Pop-off defects due to particles or debris on the substrate, ion conducting layer, and on the counter electrode layer may also cause pinhole defects. Also, if a contaminate particle is large enough and does not cause a pop-off, it might be visible when the electrochromic device is in the bleached state.

The description above, as described in relation to FIGS. 1A, 1B, 2, and 3A-D, presumes that there is a distinct ion conducting (electronically resistive) layer sandwiched between an electrochromic layer and a counter electrode layer in electrochromic devices. The description is only meant to be illustrative of how a particle can create a short related defect. That is, there are electrochromic devices where a distinct electronically resistive and ion conducting layer does not exist, but rather an interfacial region that serves as an ion conductive layer exists at the interface of the electrochromic and counter electrode layers. Electrochromic devices having this architecture are described in U.S. patent application Ser. No. 12/772,055 filed Apr. 30, 2010, Ser. No. 12/772,075 filed Apr. 30, 2010, Ser. No. 12/814,277 filed Jun. 11, 2010, Ser. No. 12/814,279 filed Jun. 11, 2010 and Ser. No. 13/166,537 filed Jun. 22, 2011, each entitled, "Electrochromic Devices," each having inventors Wang et al., and each incorporated by reference herein in their entirety. Thus particles can cause shorting defects in these devices as well, e.g., where the particle exists at and/or crosses the interface between the electrochromic and counter electrode layers and/or creates pop-off type defects as described. Such devices are also susceptible to other defect types described herein, despite not having a distinct IC layer as in conventional devices.

Thus, three types of defects are of primary concern with regard to electrochromic windows: (1) visible pinholes, (2) visible shorts, and (3) non-visible shorts. A visible pinhole will have a defect dimension of at least about 100 μm, and manifest as a very small point of light when the window is colored, sometimes unnoticeable at first glance, but visible upon scrutiny. Typically, though not necessarily, a visible short will have defect dimension of at least about 3 micrometers resulting in a region, e.g. of about 1 cm in diameter, which as mentioned is sometimes referred to as a "halo," where the electrochromic effect is perceptibly diminished. These halo regions can be reduced significantly by isolating the defect causing the visible short so that to the naked eye the visible short will resemble only a visible pinhole. Non-visible shorts can affect switching performance of the electrochromic device, by contributing to the overall leakage current of the device, but do not create discernible points of light or halos when the window is in a colored state.

Visible shorts produce a halo when the device is darkened. A halo is a region in the device where an electrical short across the electrochromic stack causes an area around the short to drain current into the short and therefore the area surrounding the short is not darkened, because the requisite electrical potential and ion arrangement is not established in this region. As mentioned, these regions can be up to about 1 cm in diameter, and thus present a problem by making the electrochromic window, when colored, unattractive to the observer. This frustrates the purpose of having windows that can operate in a colored mode.

Conventionally visible short defects are mitigated after fabrication of the electrochromic device, but while still in the production facility, for example, prior to fabrication into an insulated glass unit. For example, individual electrochromic panes are characterized by first applying temporary bus bars and then coloring the electrochromic device. Visual defects such as halos are identified and then mitigated, for example, laser circumscribed to isolate them and remove the halo effect, which leaves smaller, less discernible, pinhole defects. Alternatively, or in addition, mitigation of defects may be done on the IGU assembly. As described above, conventionally, at least two, large, dedicated apparatus, are used to carry out identification and mitigation of visual defects. However, defects can form in the electrochromic devices after the devices leave the production facility due to, for example, the inherent stresses in electrochromic devices (e.g. see above) and/or stresses applied to the windows during normal use such as installation, pressure differential between interior and exterior space, impacts that do not break the window pane and the like. Conventionally, for electrochromic windows already installed in a vehicle or building, mitigating such defects would not be done, rather the unit would be replaced in the field. This can be very expensive.

As mentioned, the methods and devices herein mitigate the visual perception of defects. In one embodiment, the number of visible pinhole defects is no greater than about 0.04 per square centimeter. In another embodiment, the number of visible pinhole defects is no greater than about 0.02 per square centimeter, and in more specific embodiments, the number of such defects is no greater than about 0.01 per square centimeter. In one embodiment, the number of short-related defects visible when the device is colored is no greater than about 0.005 per square centimeter. In another embodiment, the number of short-related defects visible when the device is colored is no greater than about 0.003 per square centimeter, and in more specific embodiments, the number of such defects is no greater than about 0.001 per square centimeter. In a further embodiment, the number of short-related defects visible when the device is colored is no greater than about 0.0005 per square centimeter. In one embodiment, the total number of visible defects, pinholes and short-related pinholes created from isolating visible short-related defects, is less than about 0.1 defects per square centimeter, in another embodiment less than about 0.08 defects per square centimeter, in another embodiment less than about 0.05 defects per square centimeter, in another embodiment less than about 0.01 defects per square centimeter, and in another embodiment less than about 0.045 defects per square centimeter (less than about 450 defects per square meter of window). In some cases, the total number of visible defects, pinholes and short-related pinholes created from isolating visible short-related defects, is less than about 0.005 defects per square centimeter.

In some embodiments, the number of non-visible electrical short defects results in leakage currents of less than 20 μA/cm 2 at ±2V bias. In one embodiment, the number of non-visible electrical short defects results in leakage currents of less than 10 μA/cm 2 at ±2V bias. In one embodiment, the number of non-visible electrical short defects results in leakage currents of less than 5 μA/cm 2 at ±2V bias. In one embodiment, the number of non-visible electrical short defects results in leakage currents of less than 2 μA/cm 2 at ±2V bias. In one embodiment, the number of non-visible electrical short defects results in leakage currents of less than 1 μA/cm 2 at ±2V bias. These values apply across the entire face of the electrochromic device (i.e., there is no region of the device (anywhere on the device) having a defect density greater than the recited value).

In some embodiments, the electrochromic device has no visible defects greater than about 1.6 mm in diameter (the largest transverse dimension of the defect). In another embodiment, the device has no visible defects greater than about 0.5 mm in diameter, and in another embodiment the device has no visible defects greater than about 100 μm in diameter.

Figure 4:
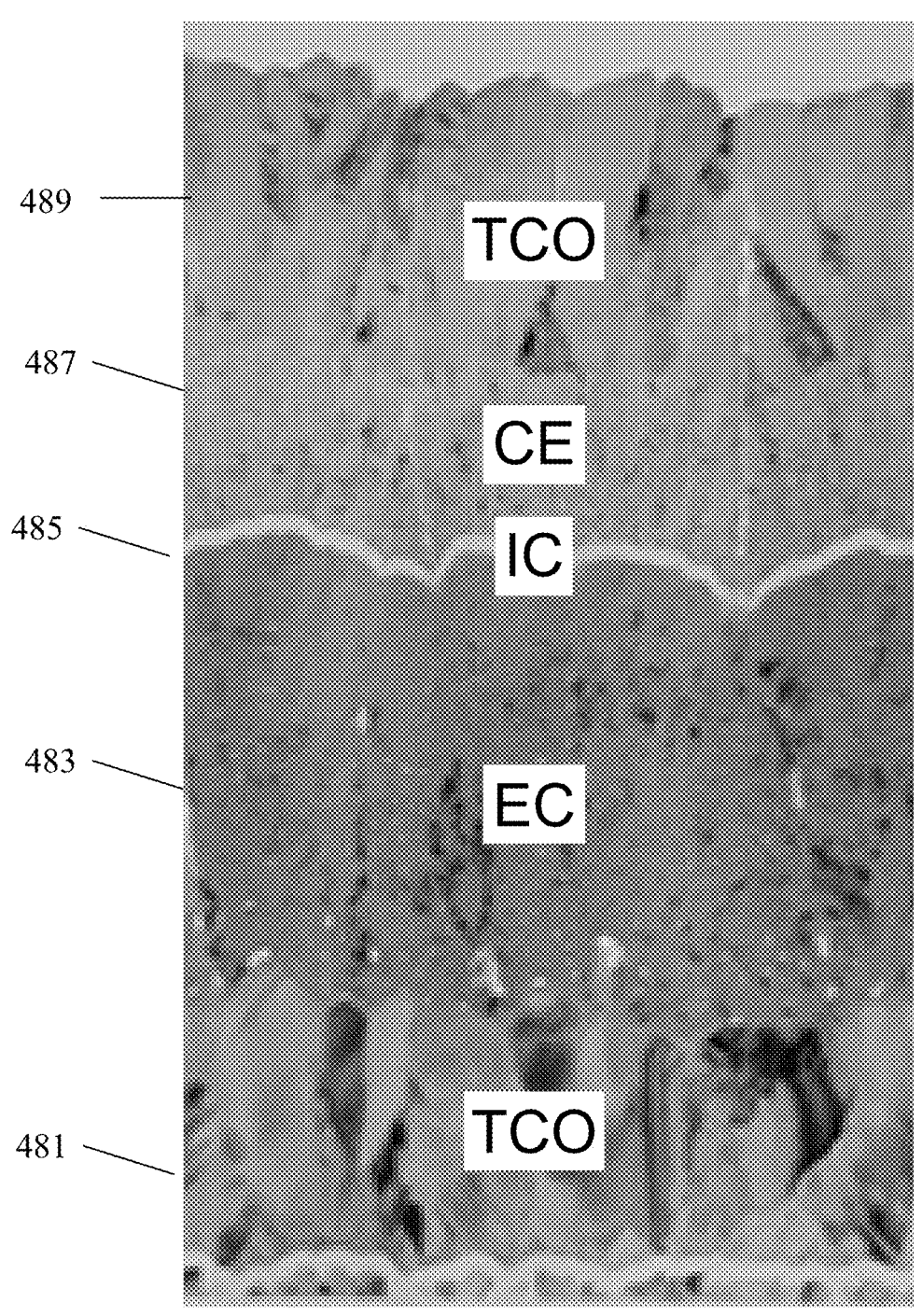
FIG. 4 is a scanning electron micrograph of an electrochromic device which does not contain any shorts or pop off defects.

FIG. 4 is a scanning electron micrograph (SEM) of an electrochromic device having a first transparent conductor layer (TCO) 481 disposed on a substrate, an electrochromic layer 483 disposed on top of TCO 481, an ion conductor layer 485 disposed on the electrochromic layer, a counter electrode layer 487 disposed on the ion conductor layer, and a second transparent conductor layer (TCO) 489. The portion of device shown does not have any pop off defects or shorts. This is an example of a "clean" structure that will be produced by a method employing a particle removal operation Process Examples As explained, a deposited particle removal operation is performed at some point in the device fabrication process. It is typically performed between formation of the first and second transparent conductive layers. In certain embodiments, the particle removal operation is performed immediately prior to a process step that has a significant likelihood of producing a particle ejection. In certain embodiments, the first particle removal operation is performed immediately after a process step that is likely to present particles in a partially fabricated device but before a process step that has a significant likelihood of producing a particle ejection. An example of a process step that is likely to eject a particle is the introduction of lithium metal into the device stack.

Figure 5A:
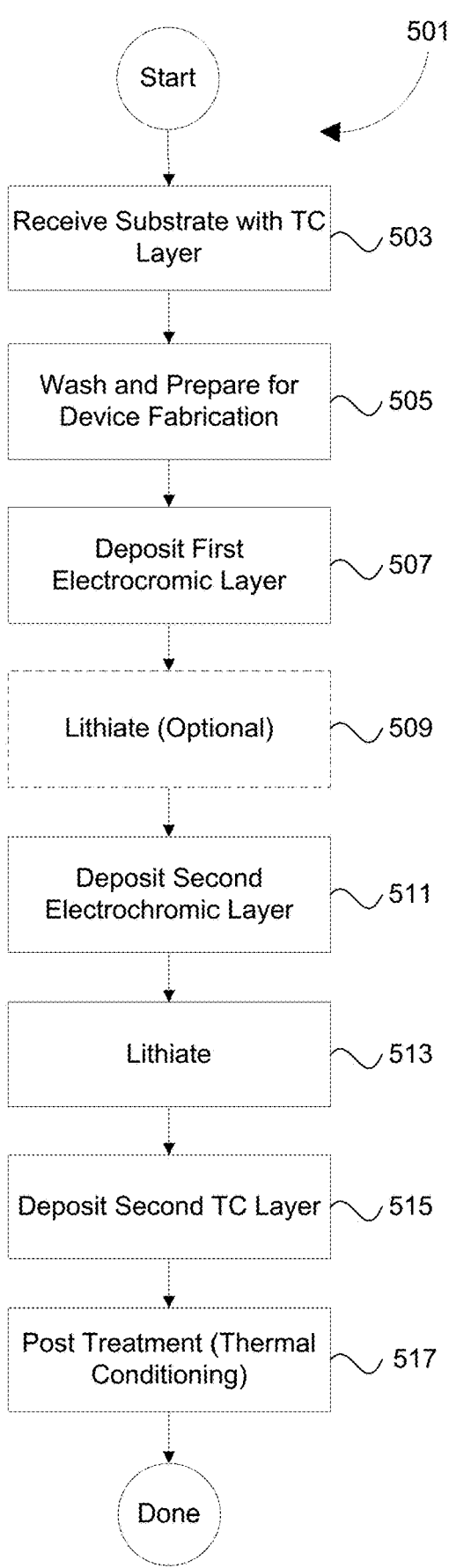
FIG. 5A is a flow chart of a baseline process for forming an electrochromic device that may be modified by introduction of one or more particle removal operations.

A device fabrication process 501 is depicted in FIG. 5A and represents a baseline process that may be modified to include one or more particle removal operations. Process 501 begins with an operation 503 where a processing facility or a pre-processing apparatus receives a substrate. As explained, the substrate may be a window, a mirror, or the like. In some implementations, the substrate provided by a substrate vendor contains a transparent conductive oxide layer pre-formed. In other implementations, the substrate is provided without the transparent conductive oxide layer, in which case, the device fabrication process includes a separate operation of forming the transparent conductive layer on the substrate.

Continuing with the process flow 501, an operation 505 involves the washing or otherwise preparing the substrate for device fabrication. This preparation may include such operations as cutting the glass to size, grinding the edges or other portions of the glass, washing it, tempering it, washing it again, etc. In some implementations, the preparation operations include first cutting the glass substrate to size for the final process, then grinding the edge of the glass, followed by tempering or other strengthening operation. In some cases, the substrate is washed before and/or after tempering. Cutting, grinding and similar operations are described in U.S. patent application Ser. No. 13/456,056, filed Apr. 25, 2012, which is incorporated herein by reference in its entirety. Fabrication of the electrochromic device itself begins after the pre-processing operation 505 is complete.

If the substrate provided after pre-processing 505 does not include a thin layer of transparent conductive material thereon, device fabrication begins by forming such layer. If the substrate as provided includes such layer, it may not be necessary to perform the operation. Regardless of how the transparent conductive material is formed, a first electrochromic layer is deposited on it in an operation 507. In certain embodiments, the first electrochromic layer includes a cathodic electrochromic material. In other embodiments, it includes an anodic electrochromic material.

In some cases, the substrate is heated prior to deposition of the first electrochromic material. The first electrochromic material layer is typically deposited by a process involving physical or chemical vapor deposition under vacuum or other controlled pressure. In a typical embodiment, the process involves sputtering a target containing elements contained in the electrochromic layer. However, in alternative embodiments, the electrochromic layer is deposited under ambient pressure such by a solution phase reaction.

In one implementation, the first electrochromic layer contains a cathodically coloring electrochromic material deposited in two operations, one providing a sub-layer of the base material in a first stoichiometry and the second providing another sub-layer of the base material in a second stoichiometry. As an example, the cathodically coloring electrochromic material is tungsten oxide, which has a nominal composition of $WO_x$. The first deposited sub-layer may have a composition of tungsten oxide in which the value of x is about 2.7 to 2.8 and the second deposited sub-layer may have a composition of tungsten oxide in which x is about 2.85 to 3.5. In one example, the first sub-layer is thicker; for example, it has a thickness of about 400 nm and the second sub-layer has a thickness of about 100 nm.

After the first electrochromic layer is deposited, the partially fabricated device is optionally lithiated as indicated at process block 509. The lithiation operation involves delivery of lithium metal or lithium ions into the first electrochromic layer. The lithium may be provided by sputtering or other suitable process. Certain aspects of lithium deposition and the targets used in lithium deposition processes are described in International Application No. PCT/US2012/034556, filed Apr. 20, 2012 (designating the US) and in International Application No. PCT/US2012/042514, filed Jun. 14, 2012 (designating the US), both of which are incorporated herein by reference in its entirety.

The next operation in device fabrication process 501 involves depositing a second electrochromic layer (an example of the counter electrode layer generally described above). See block 511. As with the deposition of the first electrochromic layer, this deposition process may be accomplishing using, e.g., physical or chemical vapor deposition. If the first electrochromic layer contains a cathodically coloring electrochromic material, then the second electrochromic layer may contain an anodically coloring electrochromic material. The opposite is also true. If the first electrochromic layer contains an anodically coloring electrochromic material, the second electrochromic layer may contain a cathodically coloring electrochromic material. In certain embodiments, the second electrochromic layer contains an anodically coloring electrochromic material such as nickel oxide or nickel doped tungsten oxide (sometimes referred to as NiWO). In some examples, where nickel tungsten oxide serves as the second electrochromic layer, it is formed to a thickness of between about 200 and 300 nm. In some cases, only one electrochromic layer is used. Ions are shuttled into and out of the single electrochromic layer, from and to a non-electrochromic counterelectrode.

In the example of FIG. 5A, no ion conducting layer is separately deposited between the first and second electrochromic layer. In alternative embodiments, an ion conducting layer is deposited between these layers. Examples of suitable ion conducting layers include those presented above in the description of FIG. 4.

After the second electrochromic layer is deposited, the device, which includes the first and second electrochromic layers, is lithiated as indicated in operation 513. The lithiation may be accomplished as described in the context of operation 509. As mentioned, lithiation operations may promote ejection of particles previously embedded in the partially fabricated electrochromic device stack. While not depicted in the process flow of FIG. 5A, a particle removal operation may be performed after any of the steps that tend to present particles in the partially fabricated device and/or before any of the steps that promote ejection of such particles. Therefore, in certain embodiments, the particle removal operation may be performed prior to lithiation operation 509 or prior to lithiation operation 513.

Returning to the process flow depicted in FIG. 5A, after the lithiation of the device in 513, the next process operation deposits a second transparent conductive oxide layer as depicted in an operation 515. At this point, all structures needed for the basic electrochromic device have been created. In some embodiments, there is a subsequent post treatment of the as deposited device in order to complete the process. See block 517. Examples of suitable post-treatment include thermal and/or chemical conditioning operations. Such operations are described in U.S. patent Ser. No. 12/645,111, previously incorporated herein by reference.

Figure 5B:
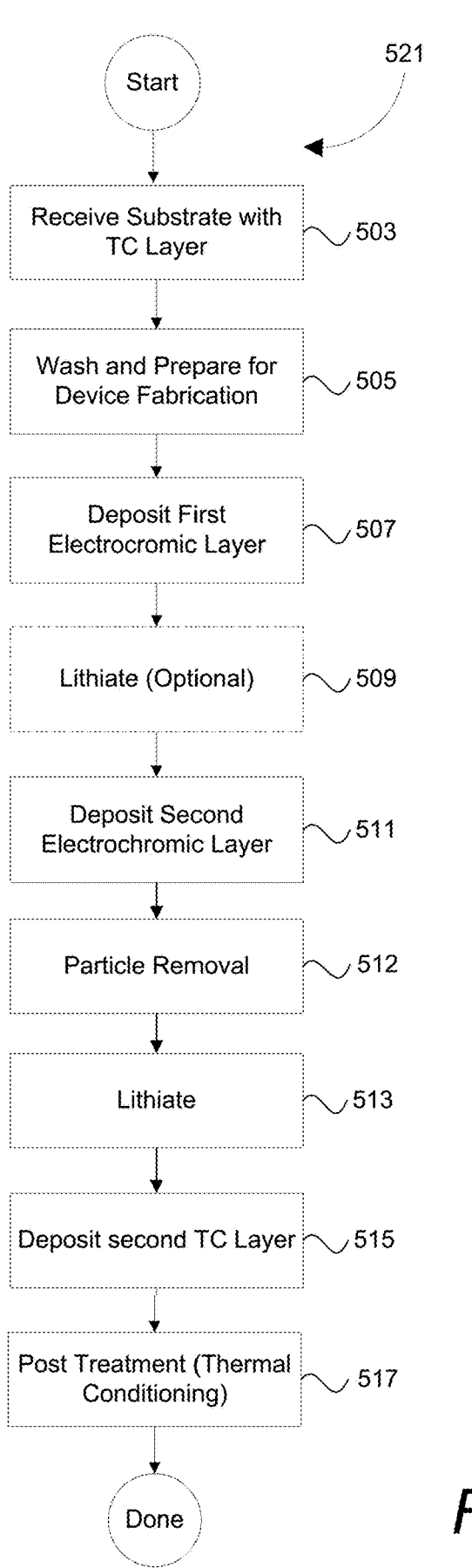

FIGS. 5B-5E present variations on the baseline process depicted in FIG. 5A. In each case, the basic process flow from FIG. 5A is depicted but with additional or different steps removing particles at particular points in the process. See e.g., operation 512 in FIG. 5B and operation 510 in FIG. 5C. In FIG. 5B, particle removal is performed before lithiation operation 513 and after deposition of the second electrochromic layer (operation 511). In FIG. 5C, process flow 523, particle removal is performed between deposition of the first electrochromic layer 507 and deposition of the second electrochromic layer (operation 511). In various embodiments, particle removal is performed prior to the first lithiation operation. As explained, the process is not limited to this sequence. Other operations that may promote particle ejection may be preceded by a particle removal operation.

In some cases, the particle removal operation is performed intermediate between two operations for depositing the second electrochromic layer. In other embodiments, the first electrochromic layer is divided into two portions, with particle removal performed between the two portions.

In some embodiments, the second electrochromic layer is a nickel tungsten oxide, which is deposited as two portions, with particle removal performed therebetween. However, the first and second portions of the second electrochromic layer are deposited under different process conditions. For example, while both portions may be deposited by a physical vapor deposition technique employing sputtering from nickel and tungsten targets, the PVD conditions are different. In some cases, the second portion is deposited at a lower pressure and/or with lower oxygen concentrations than the first portion. In some cases, the second portion of the second electrochromic layer is deposited at a lower power than the first portion. Further, the atomic ratio of nickel to tungsten may be lower in the second portion. In other cases, the atomic ratio of nickel and tungsten is the same in both portions of the layer.

Figure 5D:
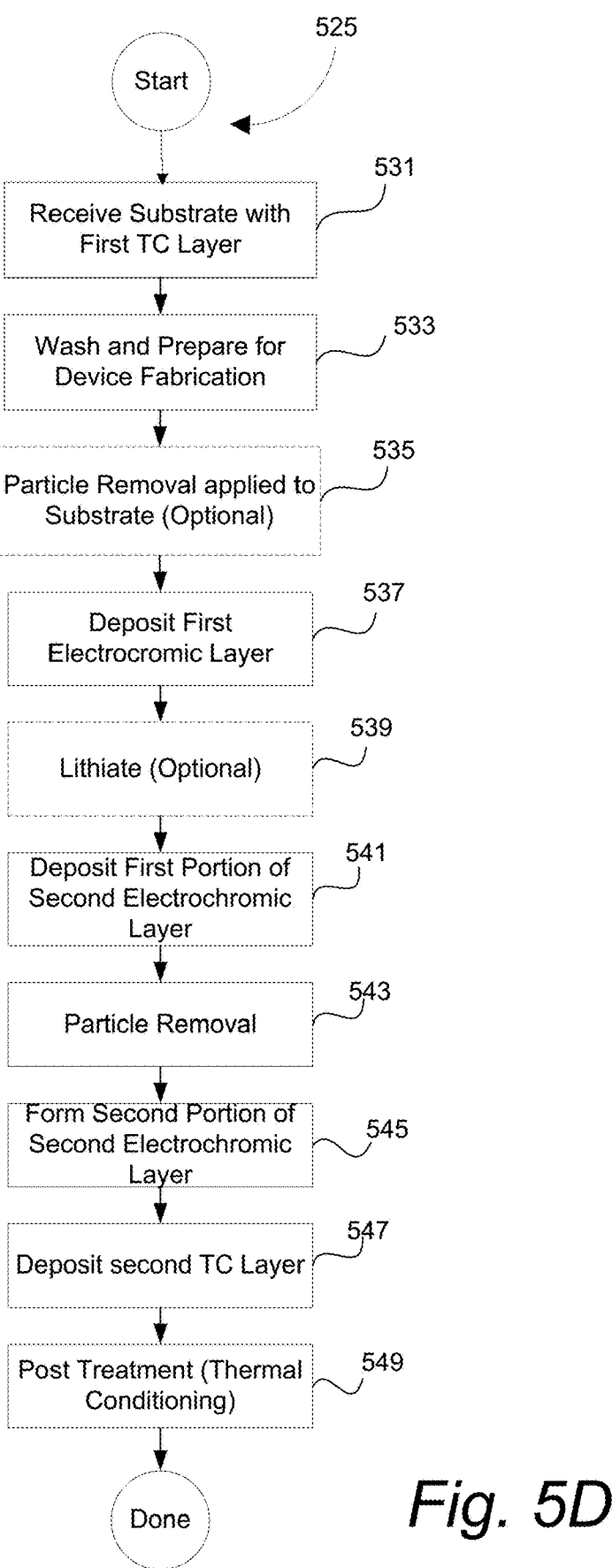
FIG. 5D is a flow chart of a process in accordance with certain embodiments in which a particle removal operation is performed at an intermediate point during the deposition of a second electrochromic layer.

In some examples, the ranges of deposition conditions for first portion of the nickel tungsten oxide electrochromic layer (NiWO1) and second portion of the nickel tungsten oxide (NiWO2) are as follows:

NiWO1
1 mTorr<Pressure<50 mTorr
60%<O2%<100% (volume or molar)
0 C<Deposition Temperature<150 C
NiWO2
1 mTorr<Pressure<50 mTorr
40%<O2%<70%<
25 C<Deposition Temperature<200 C In other examples, process conditions used to form each of NiWO1 and NiWO2 are as follows:

NiWO1
5 mTorr<Pressure<15 mTorr (or 7-12 mTorr)
70%<O2%<90% (volume) (or 70-80%)
<Deposition Temperature<60 C
NiWO2
1 mTorr<Pressure<10 mTorr (or 3-7 mTorr)
40%<O2%<60% (or 45-55%)
25 C<Deposition Temperature<60 C FIG. 5D presents a process flow, 525, for an embodiment employing particle removal at a point in the process intermediate between deposition of two portions of the same electrochromic or counter electrode layer. The process begins at an operation 531, where a substrate is received having a first transparent conducting layer. In certain embodiments, the transparent conducting layer is a fluorinated tin oxide layer that is optionally covered by an insulating layer of TiO 2. Glass substrates having such properties are provided by Pilkington of St. Helens, United Kingdom under the brand name Eclipse Advantage™ for example. The substrate received in operation 531 may be washed and prepared as described above. See operation 533. Next the process employs an optional particle removal operation as indicated at operation 535.

After the first particle removal operation is performed, the process may continue essentially as described with reference to FIGS. 5B and/or 5C. A first electrochromic layer is deposited in an operation 537, followed by an optional lithiation operation 539. Thereafter, an ion conducting layer or intermediate layer (e.g., a high oxygen content layer of the first electrochromic material) is optionally deposited or formed in situ. Regardless of whether such material is deposited, the process next involves depositing a first portion of a second electrochromic or other counter electrode layer. See operation 541. The device fabricated to this point is then processed by a particle removal device as indicated in operation 543. A second portion of the second electrochromic our counter electrode layer is formed in an operation 545. The material used to form this second portion may be the same or different from that used to form the first portion layer in operation 541. After the second portion of the second electrochromic layer has been formed, the process deposits a second transparent conductive layer. See operation 547. Thereafter an optional post treatment is performed as described above. See operation 549.

Figure 5E:
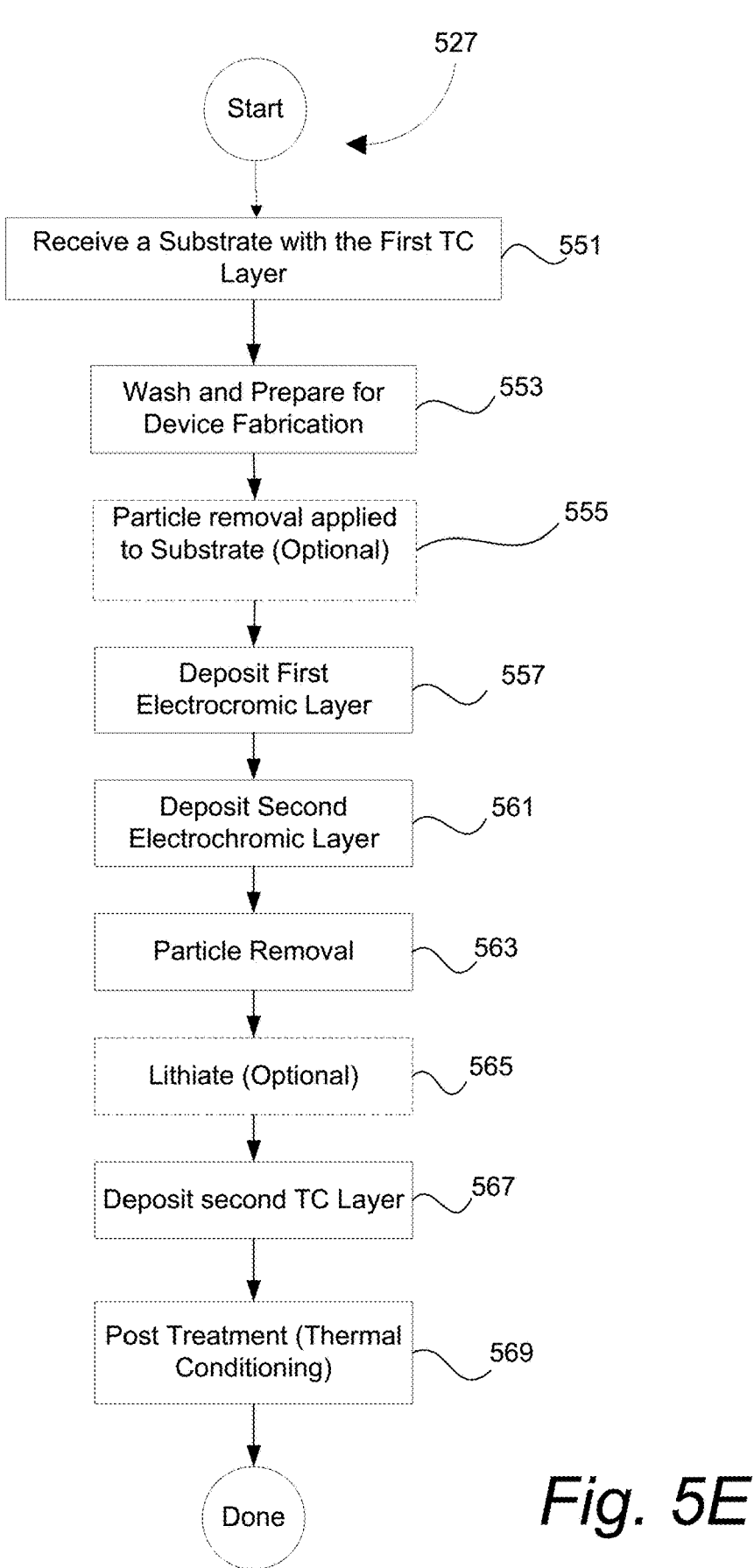
FIG. 5E is a flow chart of a process in accordance with certain embodiments in which two particle removal operations are performed.

FIG. 5E presents a process flow, 527, of forming a low-defectivity electrochromic device. The process begins as shown at a block 551 with the receipt of a substrate having one or more layers pre-formed thereon. These layers may include one or more diffusion barrier layers such as a tin oxide and a silicon oxide layer, a first transparent conductive layer such as a fluorinated tin oxide layer, and a defect-mitigating insulating layer. In certain embodiments, the defect-mitigating insulating layer may include or be titanium oxide, tin oxide, silicon oxide, silicon aluminum oxide, tantalum oxide nickel tungsten oxide, various nitrides, carbides, oxycarbides, oxynitrides, and variants of any of these, etc.

Upon receiving the substrate, it may be washed and otherwise prepared for device fabrication as indicated in block 553. The preparation may include cutting cleaning tempering, etc. Thereafter, as indicated at block 555, the substrate surface is optionally treated to remove particles. After the optional particle removal, the first and second electrochromic layers are deposited as described above and as indicated in blocks 557 and 561 of FIG. 5E. Thereafter, a particle removal operation is performed as indicated at block 563. Then, an optional lithiation operation is performed. See block 565. After the particle removal and optional lithiation operations are performed, a second transparent conductive layer is deposited as indicated by block 567. Thereafter, a post-treatment such as a thermal conditioning or thermal chemical conditioning is performed as described above. See block 569. The process is thus complete for purposes of this illustration.

The particle removal operation may be performed at various stages in the electrochromic device fabrication sequence. While the above description has focused on removal from a partially fabricated electrochromic device, it should be understood that any of the removal techniques can also be performed on a fully fabricated electrochromic device.

The standard device fabrication sequence may be interrupted at any point after depositing the first TC layer to perform particle removal, so long as the removal operation is eventually followed by the deposition or partial deposition of an insulating layer, i.e. either EC or CE. And, multiple particle removal operations may be appropriate, depending on the embodiment. A number of process examples are presented below. Each is a variation on the following base process:

Base device fabrication process
Form first TC layer
Form EC layer
Form IC layer (optional)
Form CE layer
Form second TC layer
Processes in which an ion conducting layer is not deposited in a separate operation
Option 1
Form first TC layer
Particle removal
Form EC layer
Form CE layer
Form second TC layer
Option 2
Form first TC layer
Form EC layer
Particle removal
Form CE layer
Form second TC layer
Option 3
Form first TC layer
Form EC layer
Form CE layer
Particle removal
Form second TC layer
Option 4
Form first TC layer
Form EC layer
Particle removal

18

Form CE layer
Particle removal
Form second TC layer
Option 5
Form first TC layer
Particle removal
Form EC layer
Form CE layer
Particle removal
Form second TC layer
Option 6
Form first TC layer
Form EC layer
Form partial CE layer
Particle removal
Form remainder of CE layer
Form second TC layer
Option 7
Form first TC layer
Particle removal
Form EC layer
Form partial CE layer
Particle removal
Form remainder of CE layer
Form second TC layer
Option 8
Form first TC layer
Form EC layer
Particle removal
Form partial CE layer
Particle removal
Form remainder of CE layer
Form second TC layer
Option 9
Form first TC layer
Particle removal
Form EC layer
Particle removal
Form CE layer
Form second TC layer
Option 10
Form first TC layer
Form partial EC layer
Particle removal
Form remainder of EC layer
Form CE layer
Form second TC layer
Option 11
Form first TC layer
Form partial EC layer
Particle removal
Form remainder of EC layer
Particle removal
Form CE layer
Form second TC layer
Option 12
Form first TC layer
Form partial EC layer
Particle removal
Form remainder of EC layer
Form partial CE layer
Particle removal
Form remainder of CE layer
Form second TC layer
Option 13
Form first TC layer
Form partial EC layer Particle removal
Form remainder of EC layer
Particle removal
Form partial CE layer
Particle removal
Form remainder of CE layer
Form second TC layer
Option 14
  Form first TC layer
  Particle removal
  Form partial EC layer
  Particle removal
  Form remainder of EC layer
  Particle removal
  Form partial CE layer
  Particle removal
  Form remainder of CE layer
  Form second TC layer
Processes in which an ion conducting layer is deposited in a separate operation:
Option 1
  Form first TC layer
  Particle removal
  Form EC layer
  Form IC layer
  Form CE layer
  Form second TC layer
Option 2
  Form first TC layer
  Form EC layer
  Particle removal
  Form IC layer
  Form CE layer
  Form second TC layer
Option 3
  Form first TC layer
  Form EC layer
  Form IC layer
  Particle removal
  Form CE layer
  Form second TC layer
Option 4
  Form first TC layer
  Form EC layer
  Form IC layer
  Form CE layer
  Particle removal
  Form second TC layer
Option 5
  Form first TC layer
  Form EC layer
  Particle removal
  Form IC layer
  Form CE layer
  Particle removal
  Form second TC layer
Option 6
  Form first TC layer
  Particle removal
  Form EC layer
  Form IC layer
  Form CE layer
  Particle removal
  Form second TC layer
Option 7
  Form first TC layer
  Form EC layer Form IC layer
Form partial CE layer
Particle removal
Form remainder of CE layer
Form second TC layer
Option 8
  Form first TC layer
  Form EC layer
  Particle removal
  Form IC layer
  Form partial CE layer
  Particle removal
  Form remainder of CE layer
  Form second TC layer
Option 9
  Form first TC layer
  Particle removal
  Form EC layer
  Form IC layer
  Form partial CE layer
  Particle removal
  Form remainder of CE layer
  Form second TC layer In general, depending on the embodiment, a particle removal operation may be inserted anywhere in the sequence after deposition of the first TC layer, including interrupting deposition of a CE or EC layer, so long as the particle removal operation is not inserted immediately preceding deposition of the second TC layer.

While each of the above options show the electrochromic layer deposited before the counter electrode layer, the deposition order could be reversed in any of the options. Additionally, while the above embodiments indicate that the processes form a first TC layer, it is often the case that the first TC layer in the depicted embodiments is pre-formed on the substrate provided to the device fabrication process.

In various embodiments, the particle removal operation can be coupled with an operation of forming a defect mitigating insulating layer. Such layers generally have an electronic resistivity level that is substantially greater than that of the transparent conductive layer, often orders of magnitude greater. In some embodiments, the insulating layer has an electronic resistivity that is intermediate between that of a conventional ion conducting layer and that of a transparent conductive layer (e.g., indium doped tin oxide). Thus, the electronic resistivity should be greater than about $10^{-4}$ $\Omega$-cm (approximate resistivity of indium tin oxide) or greater than about $10^{-6}$ $\Omega$-cm. In some cases, it has an electronic resistivity between about $10^{-4}$ $\Omega$-cm and $10^{14}$ $\Omega$-cm (approximate resistivity of a typical ion conductor for electrochromic devices) or between about $10^{-5}$ $\Omega$-cm and $10^{12}$ $\Omega$-cm. In certain embodiments, the electronic resistivity of the material in the insulating layer is between about 1 and $5\times10^{13}$ $\Omega$-cm or between about $10^2$ and $10^{12}$ $\Omega$-cm or between about $10^6$ and $5\times10^{12}$ $\Omega$-cm, or between about $10^7$ and $5\times10^9$ $\Omega$-cm. In some embodiments, the defect mitigating insulating layer material will have a resistivity that is comparable (e.g., within an order of magnitude) of that of the electrochromic layer of counter electrode material. In various embodiments, the defect mitigating insulating layer is deposited immediately after the particle removal operation takes place; i.e., before any other layer or portion of a device layer is deposited. Defect mitigating insulating layers, devices incorporating them, and methods of forming devices incorporating them are described in U.S. patent application Ser. No. 13/763,505, filed Feb. 8, 2013, which is incorporated herein by reference in its entirety.

In various embodiments, the particle removal happens within a high resistivity layer of the electrochromic device. In a traditional five layer EC device (the base structure above—TC1/EC/IC/CE/TC2), the particle removal may occur (a) at or after 5% of IC has been deposited but (b) before or when 95% of the IC has been deposited, and/or (c) at or after 5% of the CE has been deposited, but (d) before or when 95% of the CE has been deposited. In certain embodiments, particles are removed after a portion of a resistive constituent material (and one that stays resistive even in the presence of lithium) but before the remainder of the resistive material is deposited. The particles that are removed will leave a hole, potentially down to the TC1 layer that will then be filled with the insulating material. Any particles that are added in the process of particle removal will already reside on top of the first portion of the resistive component of the device and therefore will not pose a threat for short circuits. Note that tungsten oxide may become conductive in the presence of lithium. Therefore, in certain embodiments employing tungsten oxide as the electrochromic material, particle removal and deposition of the insulating layer occur in a layer other than the tungsten oxide layer.

Particle Removal Examples

Various techniques may serve to promote particle removal. One of these is "contact cleaning," a process that involves contacting a layer of a partially fabricated electrochromic device with a contact roller, strip, or brush, which sticks to or attracts particles and then removes them from the device. Typically, contact cleaning employs static attraction and/or adhesion to attract remove particles. Some contact cleaning products are commercially available, being marketed to the contact sheet cleaning and web cleaning industries. In various embodiments, a roller mechanism is used. In some cases, two rollers are used: the first one for contacting and removing particles from the device surface and a second roller for contacting the first roller to remove the particles that were picked up by the first roller in its most recent rotation. Examples of contact cleaning products sold for cleaning bare glass are manufactured by Teknek™ of Renfrewshire, Scotland, UK and Technica.

In some implementations, a contact cleaner is integrated with an electrochromic device fabrication system. Typically, though not always, the contact cleaner is deployed outside the vacuum environment of the system for depositing layers of the electrochromic device. In "cut and coat" fabrication process flows, a contact cleaner of a single size may be used. In other fabrication flows, contact cleaners of different size are employed for cleaning devices fabricated on glass of different sizes.

Another category of particle removal techniques rely on differences in the thermal expansion of particles and the substrate layers in which they are embedded. When the particle volume expands or contracts relative to the surrounding layers, the particles may eject, particularly when the relative volume change is rapid. In some embodiments, a mechanism driving the volume change is irradiation of the substrate at wavelength that is selectively absorbed by the particles but not the surrounding layer(s), or vice versa. In some embodiments, a mechanism driving a relative volume change is a different coefficient of thermal expansion of the particles and the surrounding layer(s).

Thermal energy may be delivered in various ways. For example, as mentioned, the particles and or the substrate layer(s) may be heated by irradiation. The irradiation may be provided at a wavelength or spectrum of wavelengths from the infrared through ultraviolet ranges. The irradiation may be provided by one or more lamp, lasers, etc. In one approach, a collimated laser beam is passed over a surface of the partially fabricated electrochromic device. For example, the beam grazes the surface of the device over the width of the device. The beam may propagate in a direction perpendicular or substantially perpendicular to the direction of travel of the substrate carrying the electrochromic device. In another approach, a laser beam is focused on the device and moved in a raster scan over the surface.

In some embodiments, thermal energy is provided by heating the substrate by a non-radiative mechanism such as passing heated gas over the surface of the substrate/device and/or passing the substrate/device over a heated element such as a roller. In one implementation, the heated element is heated by resistive heating.

In another approach to particle removal, electrostatic force is applied to the partially fabricated electrochromic device. This may be accomplished by, e.g., contacting the device with a plasma or applying a charge to the substrate containing the device. In one embodiment, a two stage process is employed. In the first stage, the particles are charged by exposure to a plasma. Then, in the second stage, the substrate with charged particles receives an electrical charge, which causes the charged particles to eject. For example, an electrical contact is made to a conductive or partially conductive layer of the substrate and charge is applied to the device through the contact. In some implementations, the substrate is contacted with a charge of the same sign as the charge applied to the particles by contact with the plasma.

In a further approach, the partially fabricated electrochromic device is exposed to a supercritical fluid such as supercritical carbon dioxide. Supercritical fluids are quite effective at dislodging and removing particles. The fluid may include a supercritical solvent such as supercritical carbon dioxide with one or more additives contained therein to improve the cleaning power or other property of the fluid. The supercritical fluid may be brought into contact with the partially fabricated electrochromic device using any of a number of processes. For example, the device may be immersed or passed through the supercritical fluid. The fluid itself may be provided in a quiescent or flowing state. In various embodiments, some convection will be employed. For example, the supercritical fluid may flow through a substrate contact chamber driven by a pump in a recirculation loop. In certain embodiments, the supercritical fluid is provided as a cryogenic aerosol. The fluid may be sprayed on the device as the device or a spray nozzle (or spray gun) moves with respect to the other.

In still another approach, particles are dislodged and/or removed by applying acoustic energy to the partially fabricated electrochromic device. The acoustic energy may be provided at any of a number of frequencies, including megasonic, supersonic, ultrasonic, etc. In certain embodiments, a vibration source is directly coupled to the substrate. In certain embodiments, a vibration source is directly coupled to a fluid in contact with the substrate/device.

Another removal technique involves ionized air blow off, optionally with an air knife.

Yet another technique involves etch-back of a layer of the device containing particles. The etch-back may be accomplished with a plasma (e.g., a fluorine or oxygen containing plasma), by using ion milling, etc. The particles may be removed by the etch-back process or merely dislodged. In one embodiment, the etch-back is performed at a sufficient depth to remove any roll off areas on the device. In the latter case, a separate particle removal operation may be applied after etch-back. Such process may include one or more other process described above such as applying a charge to the substrate, contacting the substrate with a supercritical fluid, or selectively heating the particles.

When lithiation is employed as a particle removal technique, it may be implemented in various formats. For example, the lithium may be delivered in a single dose or in multiple doses, sometimes to different layers of the device, such as to the electrochromic and counter electrode layers. In some embodiments, all the lithium needed for the device is delivered in a single operation. For example, the lithium may be delivered to the counter electrode layer and allowed to diffuse or migrate into the remainder of the device. When all lithium is provided in one operation, the incorporation provides maximal volumetric stress on the device and likely provides the most effective way to remove particles via lithiation. However, the lithiation options are not limited to a single dose.

Apparatus

In certain embodiments, some or all of the device fabrication operations are performed under vacuum or other controlled environmental conditions. For example, an in line fabrication process may involve passing the substrate through a series of interconnected chambers or stations, each associated with a particular process operation and each integrated with a vacuum system or other pressure control system. In some embodiments, the integrated deposition system includes a substrate holder and transport mechanism operable to hold the architectural glass or other substrate in a vertical or horizontal orientation while in the plurality of deposition stations. In some cases, the integrated deposition system includes one or more load locks for passing the substrate between an external environment and the integrated deposition system. In another embodiment, the plurality of deposition stations include one or more stations for depositing any one or more of the electrochromic layer, the ion conducting layer, and the counter electrode layer. Sputtering or other physical vapor deposition systems may be used for depositing any one or more of the individual layers making up the electrochromic device. A sputtering system may also be used to deposit lithium on the device. One or more stations are provided for particle removal. Such stations may optionally be included within the controlled environment of the sputtering stations.

Many types of apparatus may be employed to deposit electrochromic materials and electrochromic devices in accordance with the embodiments disclosed herein. Frequently one or more controllers are employed in the apparatus to control the fabrication process. Those of ordinary skill in the art will appreciate that processes disclosed herein may employ various processes involving data stored in or transferred through one or more computer systems and/or controllers. Certain embodiments relate to the apparatus, including associated computers and microcontrollers, for performing these operations. A control apparatus may be specially constructed for the required purposes, or it may be a general-purpose computer selectively activated or reconfigured by a computer program and/or data structure stored in the computer. The processes presented herein are not inherently related to any particular computer or other apparatus. In various embodiments, a controller executes system control software including sets of instructions for controlling the timing and sequence of the processing steps, processing conditions as described herein, and the like.

In certain embodiments, the controller contains or executes instructions for directing a substrate through a series of deposition stations for depositing the layers of the electrochromic stack. The controller may specify, inter alia, the rate and direction of substrate transfer, the sputter conditions in any station (e.g., pressure, temperature, sputtering power, and gas flow rates), and the pre- and post-treatment of a substrate. The controller may include specific instructions for polishing and otherwise pretreating the substrate prior to deposition. The controller may include specific instructions for substrate post-treatments such as thermal or chemical conditioning. The controller may specify the timing and conditions under which the particle removal device operates. Other computer programs, scripts, or routines stored on memory devices associated with the controller may be employed in some embodiments.

Figure 6A:
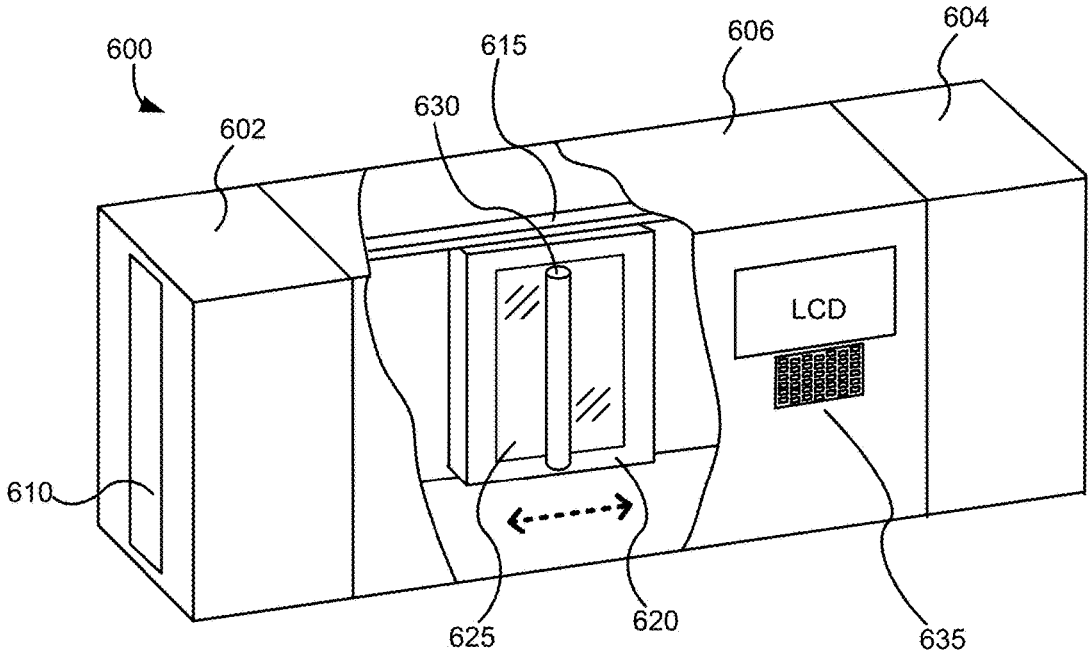
FIGS. 6A and 6B are illustrations of apparatus that may be used to fabricate electrochromic devices on substrates in vertical and horizontal configurations, respectively.

FIG. 6A depicts a simplified representation of an integrated deposition system 600 in a perspective view and with more detail including a cutaway view of the interior. In this example, system 600 is modular, where entry load lock 602 and exit load lock 604 are connected to deposition module 606. There is an entry port, 610, for loading, for example, architectural glass substrate 625 (load lock 604 has a corresponding exit port). Substrate 625 is supported by a substrate holder, pallet 620 in this example, which travels along a track, 615. In this example, pallet 620 is supported by track 615 via hanging but pallet 620 could also be supported atop a track located near the bottom of apparatus 600 or a track, for example mid-way between top and bottom of apparatus 600. Pallet 620 can translate (as indicated by the double headed arrow) forward and/or backward through system 600. For example during lithium deposition, the substrate may be moved forward and backward in front of a lithium target, 630, making multiple passes in order to achieve a desired lithiation. This function is not limited to lithium targets, however, for example a tungsten target may pass multiple times past a substrate, or the substrate may pass by via forward/backward motion path in front of the tungsten target to deposit, for example, an electrochromic layer. Pallet 620 and substrate 625 are in a substantially vertical orientation.

Target 630, in this case a cylindrical target, is oriented substantially parallel to and in front of the substrate surface where deposition is to take place (for convenience, other sputter means are not depicted here). Substrate 625 can translate past target 630 during deposition and/or target 630 can move in front of substrate 625. The movement path of target 630 is not limited to translation along the path of substrate 625. Target 630 may rotate along an axis through its length, translate along the path of the substrate (forward and/or backward), translate along a path perpendicular to the path of the substrate, move in a circular path in a plane parallel to substrate 625, etc. Target 630 need not be cylindrical, it can be planar or any shape necessary for deposition of the desired layer with the desired properties. Also, there may be more than one target in each deposition station and/or targets may move from station to station depending on the desired process. The various stations of an integrated deposition system of the invention may be modular, but once connected, form a continuous system where a controlled ambient environment is established and maintained in order to process substrates at the various stations within the system.

Integrated deposition system 600 also has various vacuum pumps, gas inlets, pressure sensors and the like that establish and maintain a controlled ambient environment within the system. These components are not shown, but rather would be appreciated by one of ordinary skill in the art. The operation of system 600 is controlled by, for example, a computer system or other controller. A user interface for such controller is represented in FIG. 6A by an LCD and a keyboard 635.

Figure 6B:
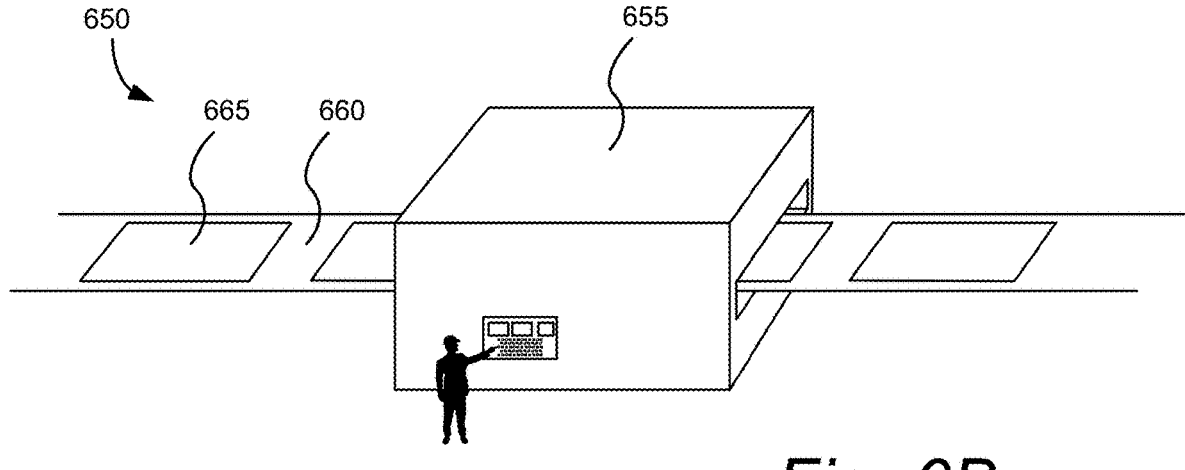

FIG. 6B illustrates a variation of the apparatus shown in FIG. 6A. While the apparatus in 6A provides the substrate oriented vertically, the apparatus of FIG. 6B provides the substrate in a horizontal orientation. There are certain advantages to processing large format glass, such as architectural glass (at least about 20"×20") in a horizontal format. It can be difficult to support vertically oriented substrates in a fixed position during deposition. Horizontal substrates, however, can be fully supported underneath and held in fixed position by gravity. However, horizontal processing suffers from particle accumulation on the substrate, which provides a large surface for falling particles. However, with the integration of a particle removal station or device in the apparatus, horizontal processing becomes feasible.

FIG. 6B shows an electrochromic fabrication system 650 configured to process substrates 665 in a horizontal orientations. A horizontally oriented track or conveyor 660 supports substrates 665 as they pass through an integrated deposition system 655. The deposition system 655 may contain multiple sputter deposition stations and optionally a particle removal station housing a particle removal device for removing particles in accordance with one or more the particle removal methods described herein. In other embodiments, the particle removal device is located outside integrated deposition system 655. In such cases, the apparatus may include two separate integrated deposition systems separated by a particle removal station. The first layer or layers are deposited in a first system, then particle removal is performed after the substrate leaves the first system. After particle removal is completed, the substrate enters the second system, where the remaining layers are deposited to complete the electrochromic device. Some or all stations employed forming layers are sputter deposition stations as described above.

Further examples of apparatus for fabricating electrochromic devices are described in the following US patent applications, each incorporated herein by reference in its entirety: Ser. Nos. 12/645,111, 12/645,159, 13/462,725, and 12/814, 279.

CONCLUSION

Although the foregoing invention has been described in some detail to facilitate understanding, the described embodiments are to be considered illustrative and not limiting. It will be apparent to one of ordinary skill in the art that certain changes and modifications can be practiced within the scope of the appended claims.

What is claimed is:

1. An apparatus for fabricating an electrochromic device, the apparatus comprising:
   (a) an integrated deposition system for forming an electrochromic stack on a substrate, the system comprising:
      (i) a first deposition station containing a first target comprising a first material for depositing a layer of an electrochromic material on a substrate when the substrate is positioned in the first deposition station;
      (ii) a second deposition station containing a second target comprising a second material for depositing a layer of a counter electrode material on the substrate when the substrate is positioned in the second deposition station;
      (iii) a particle-removal device for removing particles from a surface of the substrate and/or the surface of the electrochromic stack before it is fully-formed;
      (iv) a track configured to move the substrate from the first deposition station to the second deposition station; and
      (v) a pallet hanging vertically from the track, configured to position the substrate in a vertical orientation; and
   (b) a controller comprising:
      program instructions for passing the substrate through the first and second deposition stations in a manner that sequentially deposits a stack on the substrate, the stack comprising the layer of electrochromic material and the layer of counter electrode material; and
      program instructions for operating the particle-removal device to remove particles from the surface of the substrate and/or the surface of the electrochromic stack before it is fully-formed,
      wherein at least one of the pallet and the first target or the second target is configured to move in two opposing linear directions relative to the other during deposition of the first material or the second material.

2. The apparatus of claim 1, wherein the program instructions comprise instructions for operating the particle-removal device to remove particles before the layer of electrochromic material is fully-formed.

3. The apparatus of claim 1, wherein the program instructions comprise instructions for operating the particle-removal device to remove particles before the counter electrode layer is fully formed.

4. The apparatus of claim 1, wherein operation of the particle-removal device reduces the number of visible short-related pinhole defects in the fabricated electrochromic device to a level no greater than about 0.005 per square centimeter.

5. The apparatus of any of claim 1, wherein the integrated deposition system further comprises:
   (v) a third deposition station containing a third target comprising a third material, wherein the third deposition station is configured to deposit an electrode layer on the electrochromic stack when the substrate having the electrochromic stack is positioned in the third deposition station, and wherein the electrode layer comprises a transparent electronically conductive material.

6. The apparatus of claim 1, wherein at least one of the first target and the second target comprises a roller that rotates about an axis that is substantially parallel to a plane formed by the substrate, the roller having an outer surface configured to make contact with a surface of the substrate.

\* \* \* \* \*